United States Patent
Okuyama

(10) Patent No.: US 8,829,785 B2
(45) Date of Patent: Sep. 9, 2014

(54) ORGANIC EL DEVICE

(75) Inventor: Suguru Okuyama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 248 days.

(21) Appl. No.: 13/439,587

(22) Filed: Apr. 4, 2012

(65) Prior Publication Data
US 2012/0248971 A1 Oct. 4, 2012

(30) Foreign Application Priority Data

Apr. 4, 2011 (JP) ................................ 2011-083017
Jan. 23, 2012 (JP) ................................ 2012-010835

(51) Int. Cl.
| | | |
|---|---|---|
| H01L 51/50 | (2006.01) | |
| H05B 33/14 | (2006.01) | |
| H01L 27/32 | (2006.01) | |
| C09K 11/06 | (2006.01) | |

(52) U.S. Cl.
CPC ............ *H05B 33/14* (2013.01); *H01L 27/3209* (2013.01); *H01L 51/5044* (2013.01); *C09K 11/06* (2013.01); *H01L 51/504* (2013.01)
USPC ............................ 313/504; 313/506; 313/509

(58) Field of Classification Search
CPC ............ H01L 27/3209; H01L 51/5278; H01L 51/504; H01L 51/5044; H01L 25/048; H01L 25/0657
USPC .................................. 313/500–512; 428/690
See application file for complete search history.

(56) References Cited

U.S. PATENT DOCUMENTS

| | | | | |
|---|---|---|---|---|
| 2003/0170491 | A1* | 9/2003 | Liao et al. ...................... | 428/690 |
| 2003/0189401 | A1* | 10/2003 | Kido et al. ...................... | 313/504 |
| 2004/0150333 | A1* | 8/2004 | Tsutsui ........................... | 313/512 |
| 2005/0134174 | A1* | 6/2005 | Shiratori et al. ............... | 313/506 |
| 2012/0274201 | A1* | 11/2012 | Seo et al. ........................ | 313/504 |

FOREIGN PATENT DOCUMENTS

| | | |
|---|---|---|
| JP | 2003-045676 A | 2/2003 |
| JP | 2007-281454 A | 10/2007 |

* cited by examiner

*Primary Examiner* — Mariceli Santiago
(74) *Attorney, Agent, or Firm* — Rabin & Berdo, P.C.

(57) ABSTRACT

An organic EL device includes a light-transmitting substrate, a light-transmitting first electrode layer arranged on the substrate, three or more light-emitting units layered and arranged on the first electrode layer, each of the light-emitting units including a central organic emission layer, a hole transfer layer and an electron transfer layer, a plurality of charge generation layers, each of the charge generation layers being interposed and arranged between two corresponding adjacent ones of the light-emitting units, and a second electrode layer arranged on the light-emitting unit positioned highest in a layering direction among the light-emitting units. The total thickness of the layers interposed between the first electrode layer and the second electrode layer being 360 nm or less.

13 Claims, 27 Drawing Sheets

Distance(nm) between Light-Emitting Position and Cathode Electrode

Distance(nm) between Light-Emitting Position and Cathode Electrode

Distance(nm) between Light-Emitting Position and Cathode Electrode

FIG. 23

|  | COLOR | | | L(nm) | | |
|---|---|---|---|---|---|---|
|  | U1 | U2 | U3 | U1 | U2 | U3 |
| 1 | R | B | G | 70 | 220 | 270 |
| 2 | BR | B | G | 60 | 220 | 270 |
| 3 | G | B | R | 60 | 220 | 270 |
| 4 | BG | B | R | 60 | 220 | 270 |
| 5 | GR | B | R | 65 | 220 | 270 |
| 6 | B | G | R | 55 | 230 | 280 |
| 7 | BR | G | R | 60 | 230 | 280 |
| 8 | R | B | GR | 70 | 220 | 270 |
| 9 | B | B | GR | 55 | 220 | 270 |
| 10 | BR | B | GR | 60 | 220 | 270 |
| 11 | B | BG | R | 55 | 230 | 280 |
| 12 | R | BG | R | 70 | 230 | 280 |
| 13 | BR | BG | R | 60 | 230 | 280 |
| 14 | BR | BG | GR | 60 | 230 | 280 |

Distance(nm) between Light-Emitting Position and Cathode Electrode

Distance(nm) between Light-Emitting Position and Cathode Electrode

|   | U1 | U2 | |
|---|---|---|---|
|   | LE1 | LE21 | LE22 |
| 4 | B | G | R |
| 5 | G | B | R |
| 6 | R | B | G |

ORGANIC EL DEVICE

CROSS-REFERENCE TO RELATED APPLICATIONS

This application is based upon and claims the benefit of priority from Japanese Patent Applications No. 2011-083017 and No. 2012-010835, filed on Apr. 4, 2011 and Jan. 23, 2012, respectively, the entire contents of which are incorporated herein by reference.

TECHNICAL FIELD

The present disclosure relates to an organic EL (Electroluminescence) device and, more particularly, to an organic EL device having a thin MPE (Multi Photon Emission) structure.

BACKGROUND

In recent years, organic light-emitting devices including a display unit such as a FPD (Flat Panel Display) and a lighting unit such as a lamp are developed for practical applications using an organic EL (Electroluminescence) element. In the organic EL element, an organic EL layer including an organic light-emitting layer is interposed between a pair of mutually opposing electrodes. The organic EL layer emits light when a voltage is applied between the electrodes to allow an electric current to flow through the organic EL layer. With a view to obtain increased brightness, there is recently proposed a structure called a Multi Photon Emission (MPE) in which organic EL layers are formed one above another with a charge generation layer interposed therebetween.

When an organic EL device (hereinafter, the term "organic EL Device" is also used interchangeably to refer to an "OLED (Organic Light Emitting Diode)") is used for a lighting apparatus, an MPE structure is suitable for increasing brightness and lifespan. In the MPE structure, an organic layer is formed thick, and thus the costs grow higher. This is because the MPE structure is optimized in a single unit structure and the thickness of the organic layer is finely adjusted by layering individual units one above another. As a matter of course, simulation results are also utilized. It is however the basic design concept that the single unit structure is optimal.

In the conventional organic EL device having the MPE structure, there is a desire to reduce manufacture cost by saving material cost based on mass production.

SUMMARY

The present disclosure provides various embodiments of an organic EL device having a thin MPE structure, which is capable of optimizing the MPE structure and realizing cost reduction and high power efficiency.

According to some embodiments, there is provided an organic EL device, including: a light-transmitting substrate; a light-transmitting first electrode layer arranged on the substrate; three or more light-emitting units layered and arranged on the first electrode layer, each of the light-emitting units including a central organic emission layer, a hole transfer layer and an electron transfer layer; a plurality of charge generation layers, each of the charge generation layers being interposed and arranged between two corresponding adjacent ones of the light-emitting units; and a second electrode layer arranged on the light-emitting unit positioned highest in a layering direction among the light-emitting units, the total thickness of the layers interposed between the first electrode layer and the second electrode layer being 360 nm or less.

According to some other embodiments, there is provided an organic EL device, including: a substrate; a second electrode layer arranged on the substrate; three or more light-emitting units layered and arranged on the second electrode layer, each of the light-emitting units including a central organic emission layer, a hole transfer layer and an electron transfer layer; a plurality of charge generation layers, each of the charge generation layers being interposed and arranged between two corresponding adjacent ones of the light-emitting units; and a light-transmitting first electrode layer arranged on the light-emitting unit positioned highest in a layering direction among the light-emitting units, the total thickness of the layers interposed between the first electrode layer and the second electrode layer being 360 nm or less.

According to a some other embodiments, there is provided an organic EL device, including: a light-transmitting substrate; a light-transmitting first electrode layer arranged on the substrate; first and second light-emitting units layered and arranged on the first electrode layer, each of the first and second light-emitting units including a central organic emission layer, a hole transfer layer and an electron transfer layer; a charge generation layer interposed and arranged between the first and second light-emitting units; and a second electrode layer arranged on the first light-emitting unit positioned highest in a layering direction, the distance from the second electrode layer to the center of the organic emission layer of the first light-emitting unit adjoining to the second electrode layer being from 30 nm to 90 nm, the distance from the second electrode layer to the center of the organic emission layer of the second light-emitting unit adjoining to the first light-emitting unit being from 195 nm to 255 nm.

According to still some other embodiments, there is provided an organic EL device, including: a substrate; a second electrode layer arranged on the substrate; first and second light-emitting units layered and arranged on the second electrode layer, each of the first and second light-emitting units including a central organic emission layer, a hole transfer layer and an electron transfer layer; a charge generation layer interposed and arranged between the first and second light-emitting units; and a light-transmitting first electrode layer arranged on the second light-emitting unit positioned highest in a layering direction, the distance from the second electrode layer to the center of the organic emission layer of the second light-emitting unit adjoining to the first electrode layer being from 195 nm to 255 nm, the distance from the second electrode layer to the center of the organic emission layer of the first light-emitting unit adjoining to the second light-emitting unit being from 30 nm to 90 nm.

BRIEF DESCRIPTION OF THE DRAWINGS

FIG. 23 is a view representing the relationship of the combinations of emission colors with the distance L between the light-emitting position and the negative electrode in the organic EL devices having the thin MPE structure according to some embodiments.

DETAILED DESCRIPTION

Figure 1:
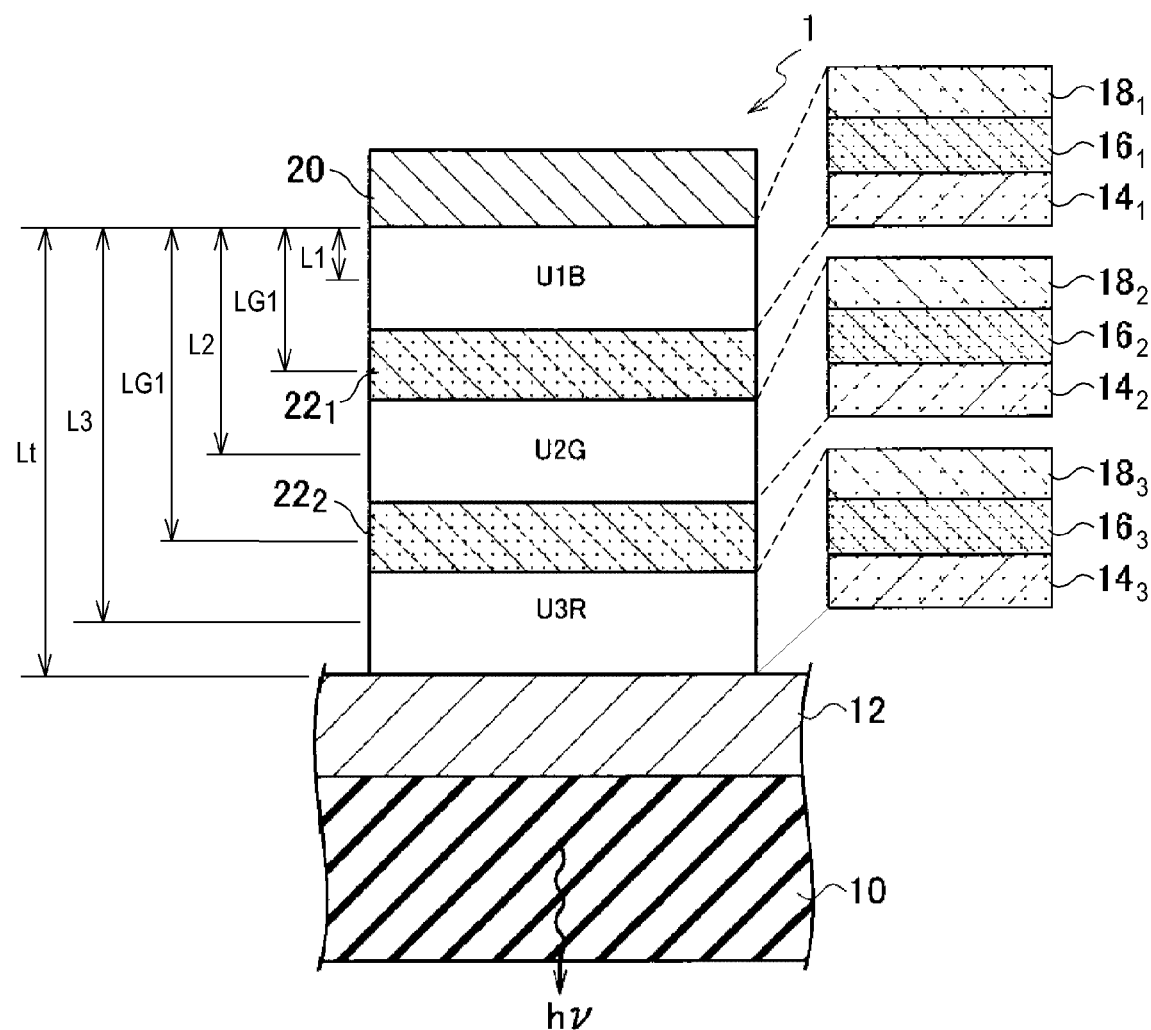
FIG. 1 is a schematic cross-sectional structure view showing an organic EL device having a thin MPE structure according to a first embodiment.

Certain embodiments of the present disclosure will now be described in detail with reference to the drawings. Throughout the drawings described herein below, identical or similar parts will be designated by identical or similar reference symbols. The drawings are schematic ones. It should be appreciated that the relationship between a thickness and a plane dimension and the thickness ratios of individual layers may differ from the actual ones. Accordingly, specific thicknesses and dimensions should be determined in light of the following description. It goes without saying that certain portions included in the drawings differ in the relationship and ratio of dimensions from one another.

The embodiments set forth below illustrate devices and methods embodying the technical concept of the present disclosure by way of example. These embodiments are not intended to limit the materials, shapes, structures and arrangements of individual components to the ones stated below. These embodiments may be modified, changed or combined in many different forms without departing from the scope of the present disclosure defined in the claims.

<First Embodiment>

A schematic cross-sectional structure of an organic EL device 1 having a thin MPE structure according to a first embodiment is shown in FIG. 1. The organic EL device 1 having the thin MPE structure according to the first embodiment is of a bottom emission type.

Figure 2:
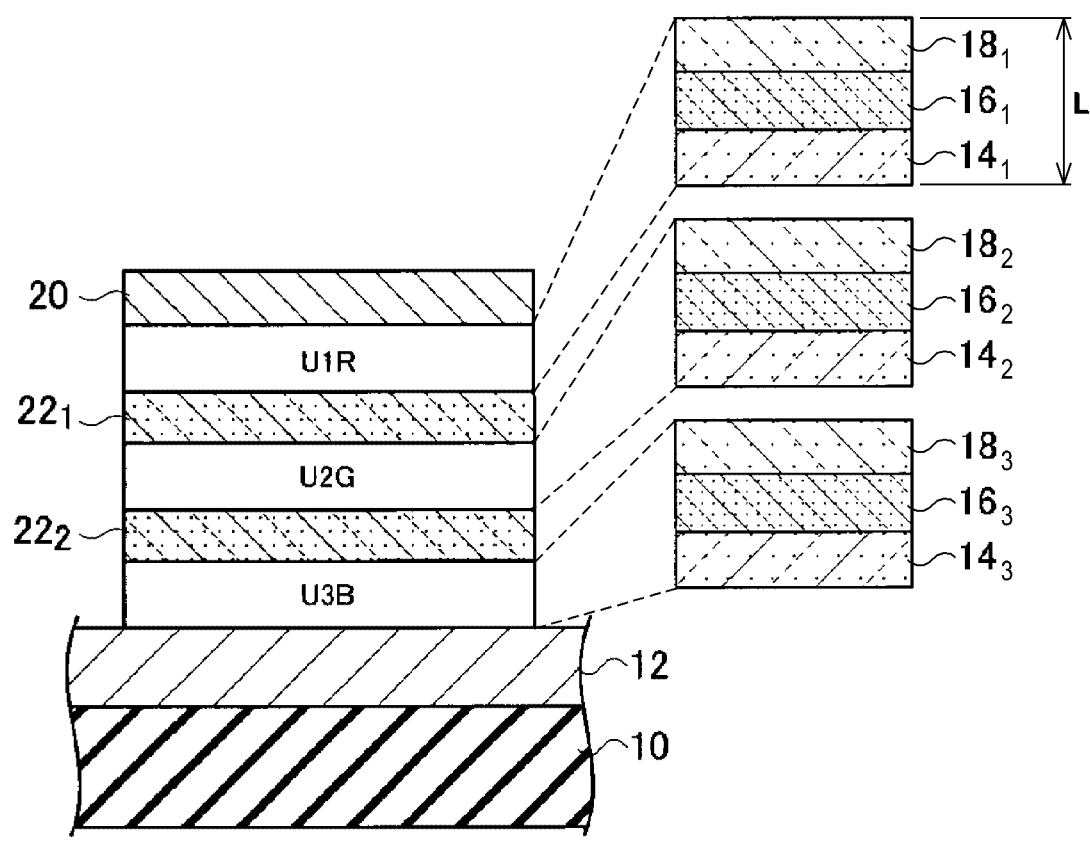
FIG. 2 is a schematic cross-sectional structure view showing an organic EL device according to a comparative example.

A schematic cross-sectional structure of an organic EL device 1 according to a comparative example is shown in FIG. 2. An MPE structure of the organic EL device according to the comparative example, may be optimized for a single unit structure and the thickness thereof can be finely adjusted by layering individual units one above another. For example, the total thickness of the layers existing between a first electrode layer 12 and a second electrode layer 20 is set larger.

In the organic EL device according to the comparative example, the thickness per unit L may typically be from 120 nm to 200 nm. In a case of a three-stage MPE, the total thickness may be from 360 nm to 600 nm.

On the other hand, as shown in FIG. 1, the organic EL device 1 having the thin MPE structure according to the first embodiment includes a light-transmitting substrate 10, a light-transmitting first electrode layer 12 arranged on the substrate 10, three or more light-emitting units U1 through Un layered and arranged on the first electrode layer 12, a plurality of charge generation layers $22_1$ through $22_{n-1}$, each of the charge generation layers $22_1$ through $22_{n-1}$ being interposed and arranged between two corresponding adjacent ones of the light-emitting units U1 through Un, and a second electrode layer 20 arranged on the light-emitting unit U1 positioned highest in a layering direction among the light-emitting units U1 through Un. Specifically, the charge generation layer $22_1$ is interposed between the light-emitting units U1 and U2. Also, the charge generation layer $22_2$ is interposed between the light-emitting units U2 and U3, and the other charge generation layers $22_3$ to $22_{n-1}$ are arranged in a similar manner, respectively. The total thickness $L_t$ of the layers interposed between the first electrode layer 12 and the second electrode layer 20 may be 360 nm or less. Each of the light-emitting units U1 through Un includes a corresponding one of central organic emission layers $16_1$ through $16_n$, a corresponding one of hole transfer layers $14_1$ through $14_n$ and a corresponding one of electron transfer layers $18_1$ through $18_n$. Specifically, the light-emitting unit U1 includes an organic emission layer $16_1$, a hole transfer layer $14_1$, and an electron transfer layer $18_1$. Also, the light-emitting unit U2 includes an organic emission layers $16_2$, a hole transfer layers $14_2$, and an electron transfer layers $18_2$. The other light emitting units U3 to Un are configured in a similar manner. These layers may be arranged, for example, in the order of the hole transfer layer, the organic emission layer and the electron transfer layer or in the order of the electron transfer layer, the organic emission layer and the hole transfer layer for each of the light-emitting units U1 through Un, from the first electrode layer 12 toward the second electrode layer 20. In other words, the layering order can be appropriately selected depending on the polarity of a bias voltage applied between the first electrode layer 12 and the second electrode layer 20.

More specifically, as shown in FIG. 1, the organic EL device 1 having the thin MPE structure according to the first embodiment includes the light-transmitting substrate 10, the light-transmitting first electrode layer 12 arranged on the substrate 10, the light-emitting units U3R, U2G and U1B layered and arranged on the first electrode layer 12, the charge generation layer $22_2$ interposed and arranged between the light-emitting units U3R and U2G and the charge generation layer $22_1$ interposed and arranged between the light-emitting units U2G and U1B. The second electrode layer 20 is arranged on the light-emitting unit U1B positioned highest in the layering direction. The total thickness $L_t$ of the layers interposed between the first electrode layer 12 and the second electrode layer 20 may be 360 nm or less.

In the organic EL device 1 having the thin MPE structure according to the first embodiment, as shown in FIG. 1, the distance L1 from the second electrode layer 20 to the center of the first organic emission layer $16_1$ of the first light-emitting unit U1B adjoining to the first electrode layer 12 among the light-emitting units U3R, U2G and U1B may be from 30 nm to 90 nm. The distance L2 from the second electrode layer 20 to the center of the second organic emission layer $16_2$ of the second light-emitting unit U2G adjoining to the first light-emitting unit U1B may be from 195 nm to 255 nm. The distance L3 from the second electrode layer 20 to the center of the third organic emission layer $16_3$ of the third light-emitting unit U3R adjoining to the second light-emitting unit U2G may be from 245 nm to 305 nm.

In the organic EL device 1 having the thin MPE structure according to the first embodiment, as shown in FIG. 1, the distance LG1 from the second electrode layer 20 to the center of the first charge generation layer $22_1$ arranged between the first light-emitting unit U1B and the second light-emitting unit U2G may be from 60 nm to 225 nm. The distance LG2 from the second electrode layer 20 to the center of the second charge generation layer $22_2$ arranged between the second light-emitting unit U2G and the third light-emitting unit U3R may be from 225 nm to 275 nm.

The charge generation layers $22_1$ and $22_2$ are made of, for example, an organic compound or an inorganic compound formed of metal as a simple substance having a melting point that is lower than aluminum. The specific resistance of the inorganic compound making up the charge generation layers $22_1$ and $22_2$ is, for example, $1\times10^2\Omega\cdot cm$ or more (e.g., $1\times10^5\Omega\cdot cm$ or more).

Examples of the inorganic compound include an oxide, a chloride, a bromide and an iodide. Examples of the metal having a melting point that is lower than aluminum (which has a melting point of about 660 degrees Celsius) include gallium (Ga), indium (In), antimony (Sb) and zinc (Zn). The melting points of Ga, In, Sb and Zn are approximately 29.8 degrees C., 156.4 degrees C., 630.7 degrees C. and 419.5 degrees C., respectively.

The charge generation layers $22_1$ and $22_2$ may be made of an organic compound. The specific resistance of the organic compound making up the charge generation layers $22_1$ and $22_2$ is, for example, $1\times10^2\Omega\cdot cm$ or more (e.g., $1\times10^5\Omega\cdot cm$ or more).

Since the organic EL device 1 having the thin MPE structure according to the first embodiment is configured to emit light at the side of the substrate 10, a light-transmitting transparent substrate is used as the substrate 10. The substrate 10 may be made of, for example, glass. The thickness of the substrate 10 may be, for example, from about 0.1 to about 1.1 mm. The substrate 10 can be made of a transparent resin such as polycarbonate or polyethylene terephthalate, that have flexibility properties.

The first electrode layer 12 is formed of a light-transmitting transparent ITO (indium-tin oxide) electrode having a thickness of, for example, from about 140 nm to about 160 nm.

In each of the light-emitting units U1, U2 and U3, the hole transfer layer s $14_1$ through $14_3$, the organic emission layers $16_1$ through $16_3$ and the electron transfer layers $18_1$ through $18_3$ are layered in the named order from the side of the substrate 10. The layering order is not limited thereto but may be appropriately selected depending on the polarity of a bias voltage.

The hole transfer layers $14_1$ through $14_3$ are layers for efficiently transferring the positive holes injected from the first electrode layer 12 to the organic emission layers $16_1$ through $16_3$, and are made of, for example, NPB(N,N-di (naphthalene)-N,N-diphenyl-benzylidene) having a thickness of about 60 nm.

The electron transfer layers $18_1$ through $18_3$ are layers for transferring the electrons injected from the second electrode layer 20 and charge generation layers $22_1$ and $22_2$ to the organic emission layers $16_1$ through $16_3$ and are made of, for example, $Alq_3$ (aluminum-quinolinol complex) having a thickness of about 35 nm.

The organic emission layers $16_1$ through $16_3$ are layers in which the injected positive holes and the injected electrons are recombined to emit light. The organic emission layers $16_1$ through $16_3$ may be made of, for example, $Alq_3$ of about 30 nm in thickness doped with about 1% of a coumarin compound (C545T), one of emission species.

Alternatively, some of the organic emission layers $16_1$ through $16_3$ may be made of, for example, $Alq_3$ of about 30 nm to 50 nm in thickness doped with, for example, about 1% of DPVBi(4,4'-bis(2,2'-diphenylvinyl)-1,1'-biphenyl), one of blue emission species.

Alternatively, some of the organic emission layers $16_1$ through $16_3$ may be made of, for example, $Alq_3$ of about 30 nm to 50 nm in thickness doped with, for example, about 1% of dimethyl quinacridone, which is one of a green emission species.

Alternatively, some of the organic emission layers $16_1$ through $16_3$ may be made of, for example, $Alq_3$ of about 30 nm to 50 nm in thickness doped with, for example, about 1% of nile red (9-diethylamino-5H-benzo(a)phenoxazine-5-one, which is one of a red emission species.

The light-emitting units U1, U2 and U3 may include, for example, hole injection layers (HILs) and electron injection layers (EILs), instead of the hole transfer layers $14_1$ through $14_3$ and the electron transfer layers $18_1$ through $18_3$, respectively.

The second electrode layer 20 has a thickness of, for example, about 150 nm, and is made of, for example, aluminum.

<Operation Principle>

The operation of the organic EL device 1 having the thin MPE structure according to the first embodiment is described as follows.

First, a specified voltage is applied between the first electrode layer 12 and the second electrode layer 20 via the positive and negative terminals (not shown) of the organic EL device 1 having the thin MPE structure. Consequently, positive holes are injected from the first electrode layer 12 or the charge generation layers $22_1$ and $22_2$ into the organic emission layers $16_1$ through $16_3$ via the hole transfer layers $14_1$ through $14_3$ while electrons are injected from the second electrode layer 20 or the charge generation layers $22_1$ and $22_2$ into the organic emission layers $16_1$ through $16_3$ via the electron transfer layers $18_1$ through $18_2$. The positive holes and electrons injected into the organic emission layers $16_1$ through $16_2$ are recombined to thereby emit light beams of blue, green or red colors. These light beams are mixed with one another and are emitted outward via the substrate 10, thus forming a white light beam.

In the first embodiment, the light-emitting units U1, U2 and U3 may include the hole transfer layers $14_1$ through $14_3$, the organic emission layers $16_1$ through $16_3$ capable of emitting a single-color light beam and the electron transfer layers $18_1$ through $18_3$. The light-emitting unit U1 may include hole injection layers. The light-emitting units U1, U2 and U3 are provided in plural numbers and may be set appropriately, but the number of the light-emitting units U1, U2 and U3 is not particularly limited.

Figure 6:
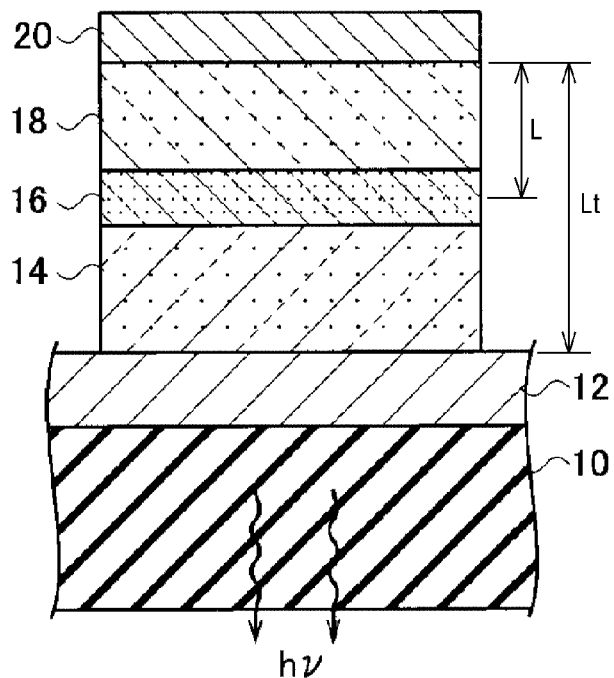
FIG. 6 is a schematic cross-sectional structure view for illustrating the operation principle of the organic EL device having the thin MPE structure according to the first embodiment.

A schematic cross-sectional structure for illustrating the operation principle of the organic EL device 1 having the thin MPE structure according to the first embodiment is shown in FIG. 6.

Referring to FIG. 6, if the distance L between the light-emitting position and the second electrode (cathode electrode) 20 is changed while keeping constant the thickness $L_t$ between the first electrode layer 12 and the second electrode layer 20, the total amount of the light emitted into the substrate 10 (i.e., the total luminous flux ø) is periodically changed depending on the distance L between the light-emitting position and the cathode electrode.

Figure 7:
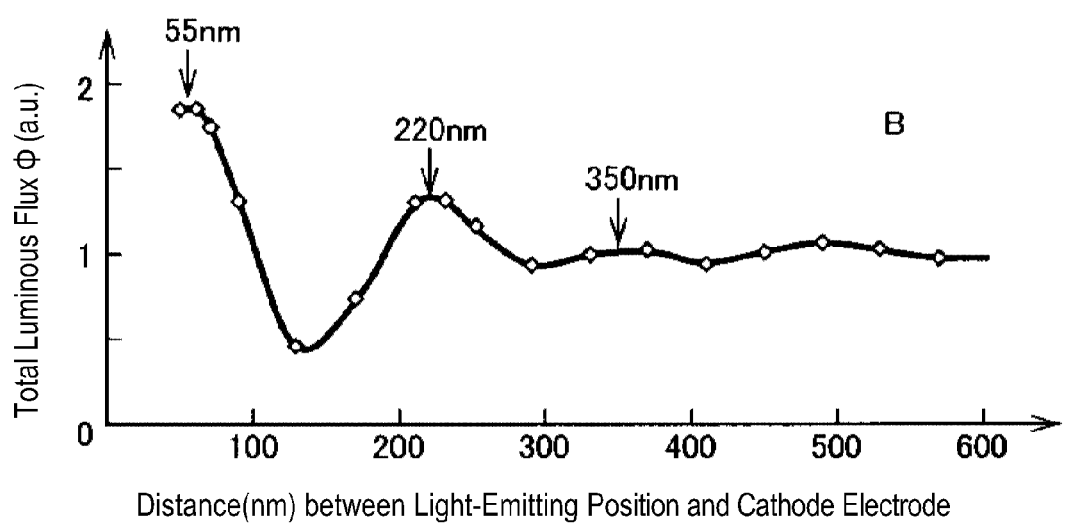
FIG. 7 is a view representing the relationship of the total luminous flux ø in a case of blue light emission with the distance L between the light-emitting position and the negative electrode in the organic EL device having the thin MPE structure according to the first embodiment.
Figure 8:
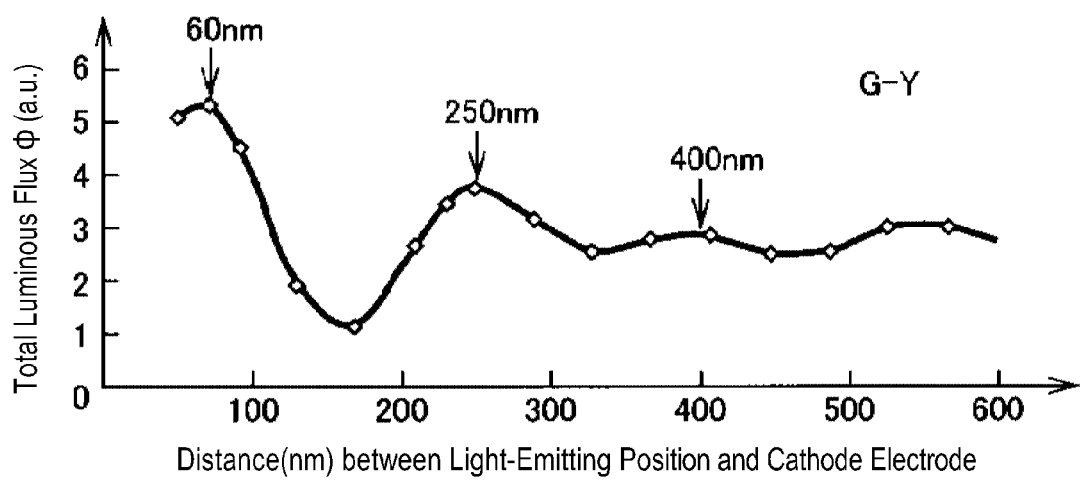
FIG. 8 is a view representing the relationship of the total luminous flux ø in a case of greenish yellow light emission with the distance L between the light-emitting position and the negative electrode in the organic EL device having the thin MPE structure according to the first embodiment.
Figure 9:
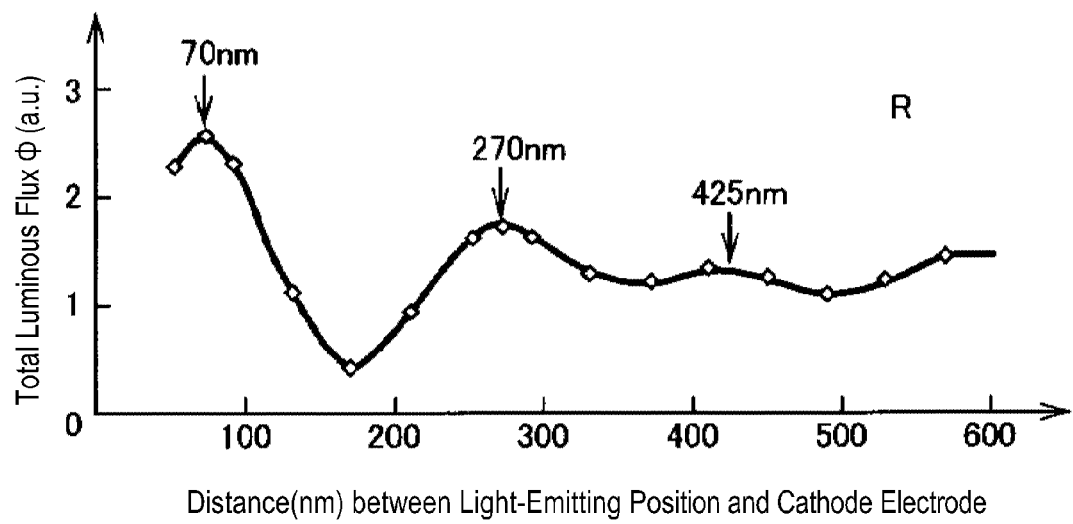
FIG. 9 is a view representing the relationship of the total luminous flux ø in a case of red light emission with the distance L between the light-emitting position and the negative electrode in the organic EL device having the thin MPE structure according to the first embodiment.

In the organic EL device 1 having the thin MPE structure according to the first embodiment, the relationship of the total luminous flux ø in a case of blue (B) light emission with the distance L between the light-emitting position and the cathode electrode is shown in FIG. 7. The relationship of the total luminous flux ø in a case of greenish yellow (G-Y) light emission with the distance L between the light-emitting position and the cathode electrode is shown in FIG. 8. The relationship of the total luminous flux ø in a case of red (R) light emission with the distance L between the light-emitting position and the cathode electrode is shown in FIG. 9. As is apparent in FIGS. 7 through 9, the values of the distance L between the light-emitting position and the cathode electrode, at which the peaks of the total luminous flux ø become available, are shifted depending on the light emission colors. As shown in FIG. 7, the values of the distance L between the light-emitting position and the cathode electrode, at which the peaks of the total luminous flux ø in the case of blue light emission become available, are about 55 nm, about 220 nm and about 350 nm. As shown in FIG. 8, the values of the distance L between the light-emitting position and the cathode electrode, at which the peaks of the total luminous flux ø in the case of greenish yellow light emission become available, are about 60 nm, about 250 nm and about 400 nm. As shown in FIG. 9, the values of the distance L between the light-emitting position and the cathode electrode, at which the peaks of the total luminous flux ø in the case of red light emission become available, are about 70 nm, about 270 nm and about 425 nm.

Figure 10:
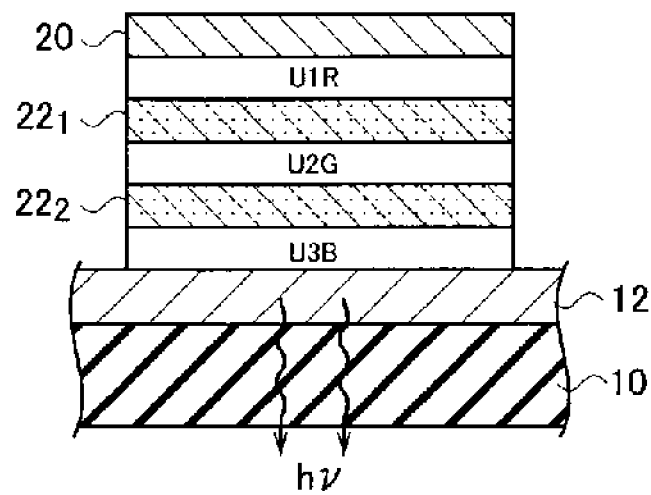
FIG. 10 is a schematic cross-sectional structure view showing an organic EL device according to a comparative example.

On the other hand, a schematic cross-sectional structure for illustrating the operation principle of the organic EL device according to the comparative example is shown in FIG. 10. If a light emission material having a wider energy gap (a shorter wavelength) is arranged at the front side (the light emission side) due to, for example, a concern that a red light emission unit having a relatively narrow energy gap may possibly absorb the light emitted from a blue light emission unit having higher energy, the arrangement of colors of the light emission units in case of RGB is fixed to the order of U1R, U2G and U3B from the second electrode layer 20 toward the first electrode layer 12 as shown in FIG. 10.

Figure 11:
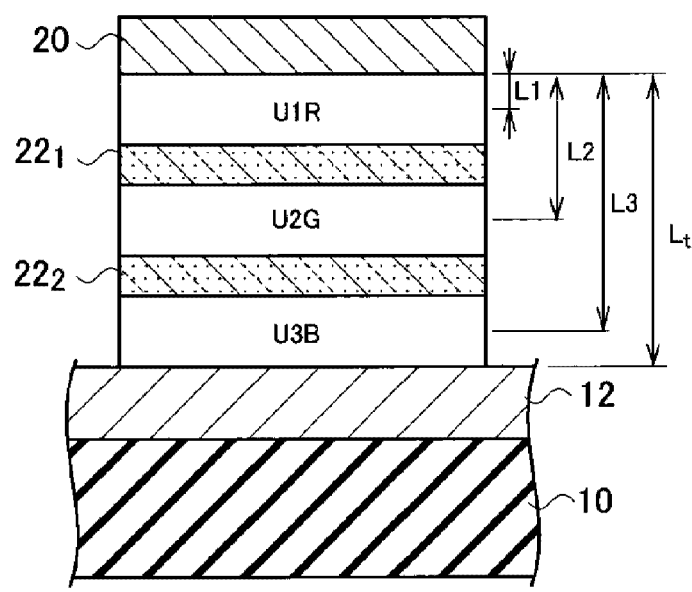
FIG. 11 is a schematic cross-sectional structure view for illustrating the light-emitting position where the total luminous flux of the respective colors becomes greatest in the organic EL device according to the comparative example.

A schematic cross-sectional structure for illustrating the light-emitting position where the total luminous flux of the respective colors becomes greatest in the organic EL device according to the comparative example is shown in FIG. 11.

Figure 12:
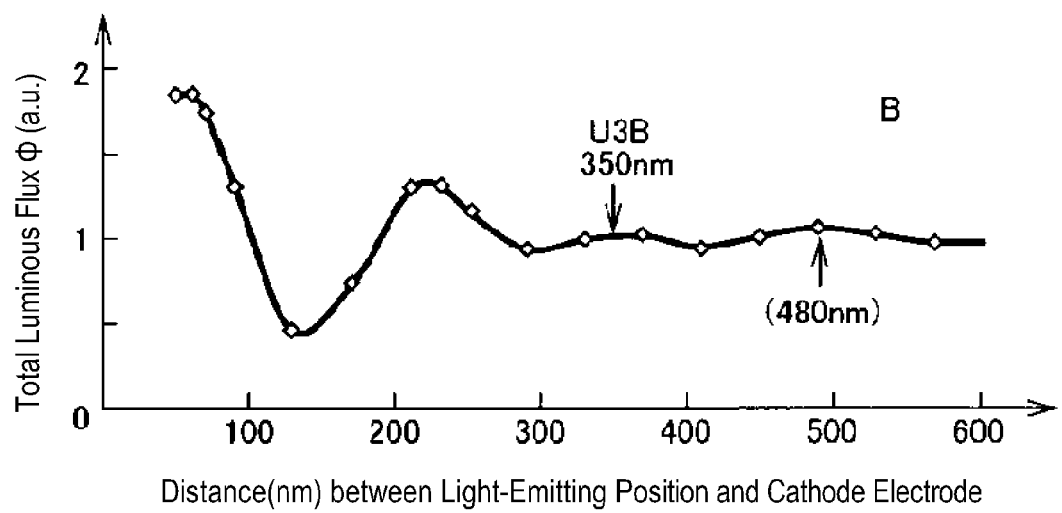
FIG. 12 is a view representing the relationship of the total luminous flux ø in a case of blue light emission with the distance L between the light-emitting position and the negative electrode in the organic EL device according to the comparative example.

FIG. 12 is a view representing the relationship of the total luminous flux ø in a case of blue light emission with the distance L between the light-emitting position and the cathode electrode in the organic EL device according to the comparative example.

Figure 13:
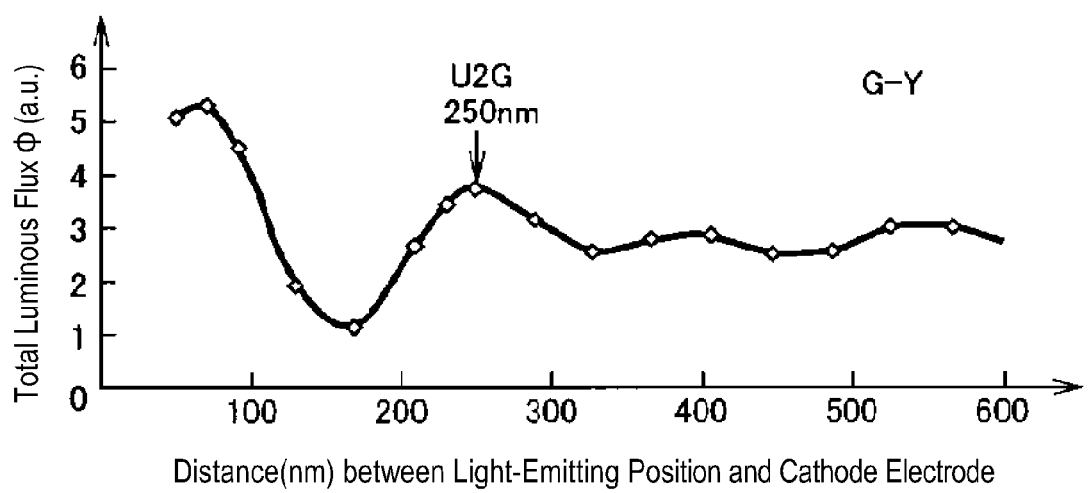
FIG. 13 is a view representing the relationship of the total luminous flux ø in a case of greenish yellow light emission with the distance L between the light-emitting position and the negative electrode in the organic EL device according to the comparative example.

FIG. 13 is a view representing the relationship of the total luminous flux ø in a case of greenish yellow light emission with the distance L between the light-emitting position and the cathode electrode in the organic EL device according to the comparative example.

Figure 14:
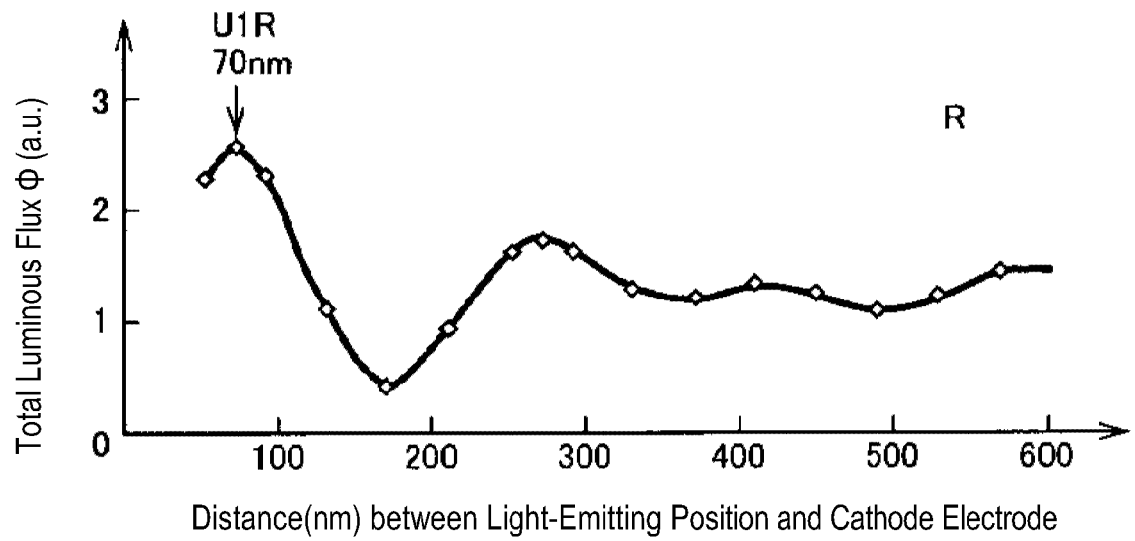
FIG. 14 is a view representing the relationship of the total luminous flux ø in a case of red light emission with the distance L between the light-emitting position and the negative electrode in the organic EL device according to the comparative example.

FIG. 14 is a view representing the relationship of the total luminous flux ø in a case of red light emission with the distance L between the light-emitting position and the cathode electrode in the organic EL device according to the comparative example.

In the organic EL device according to the comparative example, the relationship of the total luminous flux ø in the case of blue (B) light emission with the distance L between the light-emitting position and the cathode electrode is shown in FIG. 12. The relationship of the total luminous flux ø in the case of greenish yellow (G-Y) light emission with the distance L between the light-emitting position and the cathode electrode is shown in FIG. 13. The relationship of the total luminous flux ø in the case of red (R) light emission with the distance L between the light-emitting position and the cathode electrode is shown in FIG. 14.

As shown in FIG. 14, a peak value of the total luminous flux ø becomes available when the distance L1 from the second electrode layer 20 to the center of the first organic emission layer $16_1$ of the first light-emitting unit U1R adjoining to the second electrode layer 20 is about 70 nm. As shown in FIG. 13, a peak value of the total luminous flux ø becomes available when the distance L2 from the second electrode layer 20 to the center of the second organic emission layer $16_2$ of the second light-emitting unit U2G adjoining to the first light-emitting unit U1R is about 250 nm. As shown in FIG. 12, peak values of the total luminous flux ø become available when the values of the distance L3 from the second electrode layer 20 to the center of the third organic emission layer $16_3$ of the third light-emitting unit U3B adjoining to the second light-emitting unit U2G are about 350 nm and about 480 nm. In this manner, the light-emitting positions where the total luminous flux ø of the respective colors becomes greatest are decided as shown in FIGS. 12 through 14.

In the organic EL device according to the comparative example, the total thickness $L_t$ of the layers interposed between the first electrode layer 12 and the second electrode layer 20 is greater than 350 nm. In reality, if the thickness of the hole transfer layers $14_1$ through $14_n$ and the like is taken into account, it is apparent that the total thickness $L_t$ exceeds 360 nm.

With the first embodiment, it is possible to provide a bottom-emission-type organic EL device having the thin MPE structure, which is capable of optimizing the MPE structure and realizing cost reduction and high power efficiency.

<Second Embodiment>

Figure 3:
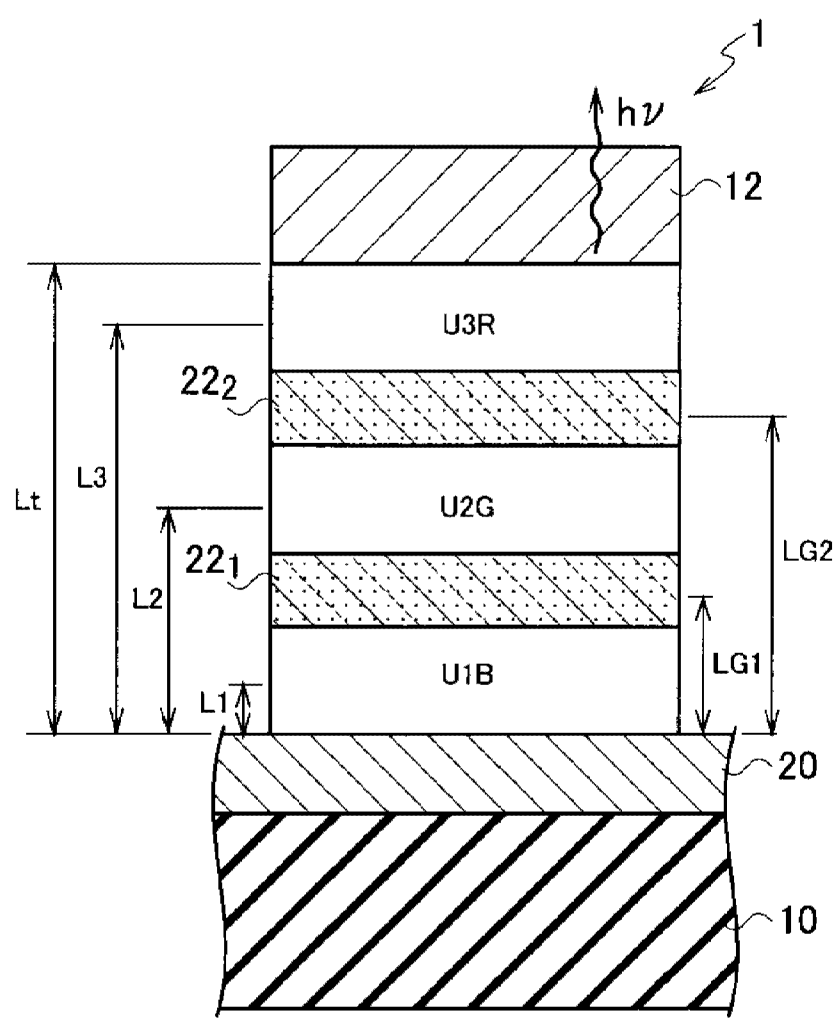
FIG. 3 is a schematic cross-sectional structure view showing an organic EL device having a thin MPE structure according to a second embodiment.

A schematic cross-sectional structure of an organic EL device 1 having a thin MPE structure according to a second embodiment is shown in FIG. 3. The organic EL device 1 having the thin MPE structure according to the second embodiment is of a bottom emission type.

Referring to FIG. 3, the organic EL device 1 having the thin MPE structure includes a substrate 10, a second electrode layer 20 arranged on the substrate 10, three or more light-emitting units U1 through Un layered and arranged on the second electrode layer 20, a plurality of charge generation layers $22_1$ through $22_{n-1}$, each of the charge generation layers $22_1$ through $22_{n-1}$ being interposed and arranged between two corresponding adjacent ones of the light-emitting units U1 through Un, and a light-transmitting first electrode layer 12 arranged on the light-emitting unit Un positioned highest in the layering direction among the light-emitting units U1 through Un. The total thickness $L_t$ of the layers interposed between the first electrode layer 12 and the second electrode layer 20 is 360 nm or less. Each of the light-emitting units U1 through Un includes corresponding one of central organic emission layers $16_1$ through $16_n$, corresponding one of hole transfer layers $14_1$ through $14_n$ and corresponding one of electron transfer layers $18_1$ through $18_n$. These layers may be arranged, for example, in the order of the hole transfer layer, the organic emission layer and the electron transfer layer or in the order of the electron transfer layer, the organic emission layer and the hole transfer layer for each of the light-emitting units U1 through Un, from the first electrode layer 12 toward the second electrode layer 20. In other words, the layering order can be appropriately selected depending on the polarity of a bias voltage applied between the first electrode layer 12 and the second electrode layer 20.

More specifically, as shown in FIG. 3, the organic EL device 1 having the thin MPE structure according to the second embodiment includes a substrate 10, a second electrode layer 20 arranged on the substrate 10, a plurality of light-emitting units U1B, U2G and U3R layered and arranged on the second electrode layer 20, a plurality of charge generation layers $22_1$ and $22_2$, each of the charge generation layers $22_1$ and $22_2$ being interposed and arranged between two corresponding adjacent ones of the light-emitting units U1B, U2G and U3R, and a light-transmitting first electrode layer 12 arranged on the light-emitting unit U3R positioned highest in the layering direction. The total thickness $L_t$ of the layers interposed between the first electrode layer 12 and the second electrode layer 20 may be 360 nm or less.

In the organic EL device 1 having the thin MPE structure according to the second embodiment, the distance L1 from the second electrode layer 20 to the center of the first organic emission layer $16_1$ of the first light-emitting unit U1B adjoining to the second electrode layer 20 among the light-emitting units U1B, U2G and U3R may be from 30 nm to 90 nm. The distance L2 from the second electrode layer 20 to the center of the second organic emission layer $16_2$ of the second light-emitting unit U2G adjoining to the first light-emitting unit U1B may be from 195 nm to 255 nm. The distance L3 from the second electrode layer 20 to the center of the third organic emission layer $16_3$ of the third light-emitting unit U3R adjoining to the second light-emitting unit U2G may be from 245 nm to 305 nm.

In the organic EL device 1 having the thin MPE structure according to the second embodiment, the distance LG1 from the second electrode layer 20 to the center of the first charge generation layer $22_1$ arranged between the first light-emitting unit U1B and the second light-emitting unit U2G among the charge generation layers $22_1$ and $22_2$ may be from 60 nm to 225 nm. The distance LG2 from the second electrode layer 20 to the center of the second charge generation layer $22_2$ arranged between the second light-emitting unit U2G and the third light-emitting unit U3R may be from 225 nm to 275 nm.

With the second embodiment, it is possible to provide a top-emission-type organic EL device having the thin MPE structure, which is capable of optimizing the MPE structure and realizing cost reduction and high power efficiency.

<Third Embodiment>

Figure 4:
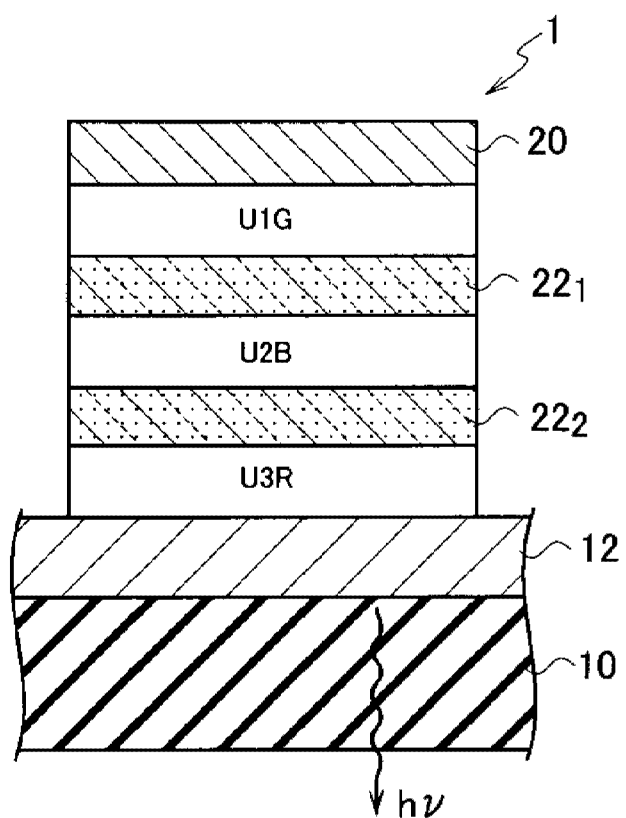
FIG. 4 is a schematic cross-sectional structure view showing an organic EL device having a thin MPE structure according to a third embodiment.

A schematic cross-sectional structure of an organic EL device 1 having a thin MPE structure according to a third embodiment is shown in FIG. 4. In the organic EL device 1 having the thin MPE structure according to the third embodiment, the peak of an emission wavelength of the first light-emitting unit U1G adjoining to the second electrode layer 20 among the light-emitting units U1G, U2B and U3R is from 500 nm to 600 nm. The peak of an emission wavelength of the second light-emitting unit U2B adjoining to the first light-emitting unit U1G is from 400 nm to 500 nm. The peak of an emission wavelength of the third light-emitting unit U3R adjoining to the second light-emitting unit U2B is from 550 nm to 700 nm. Other configurations remain the same as the configurations of the first embodiment or the second embodiment. Therefore, these descriptions will not repeated, in the interest of brevity.

Figure 15:
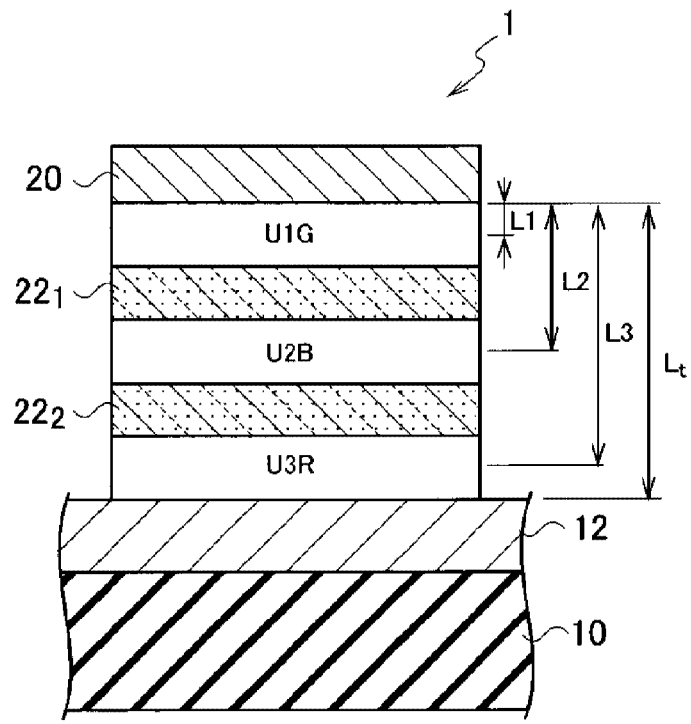
FIG. 15 is a schematic cross-sectional structure view for illustrating the light-emitting position where the total luminous flux of the respective colors becomes greatest in the organic EL device having the thin MPE structure according to the third embodiment.

A schematic cross-sectional structure for illustrating the light-emitting position where the total luminous flux of the respective colors becomes greatest in the organic EL device 1 having the thin MPE structure according to the third embodiment is shown in FIG. 15.

Figure 16:
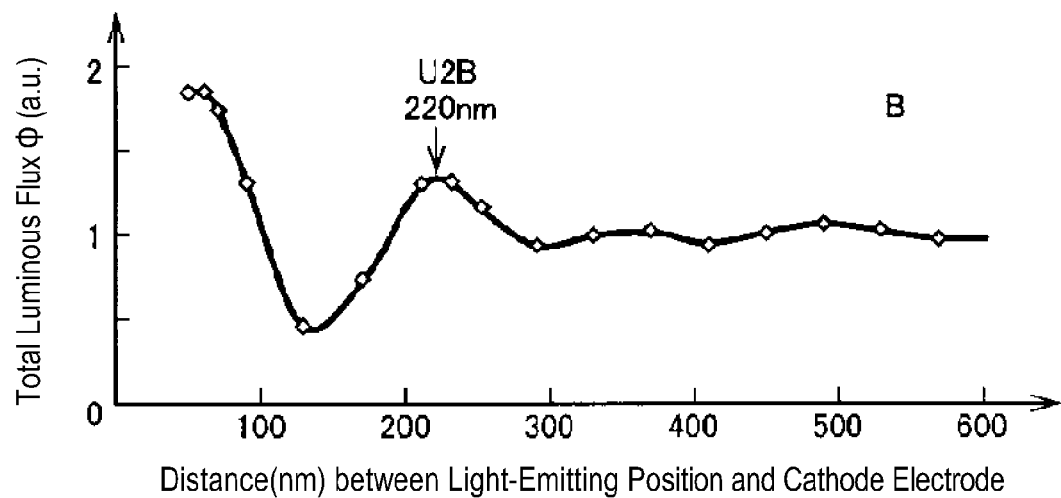
FIG. 16 is a view representing the relationship of the total luminous flux ø in a case of blue light emission with the distance L between the light-emitting position and the negative electrode in the organic EL device having the thin MPE structure according to the third embodiment.
Figure 17:
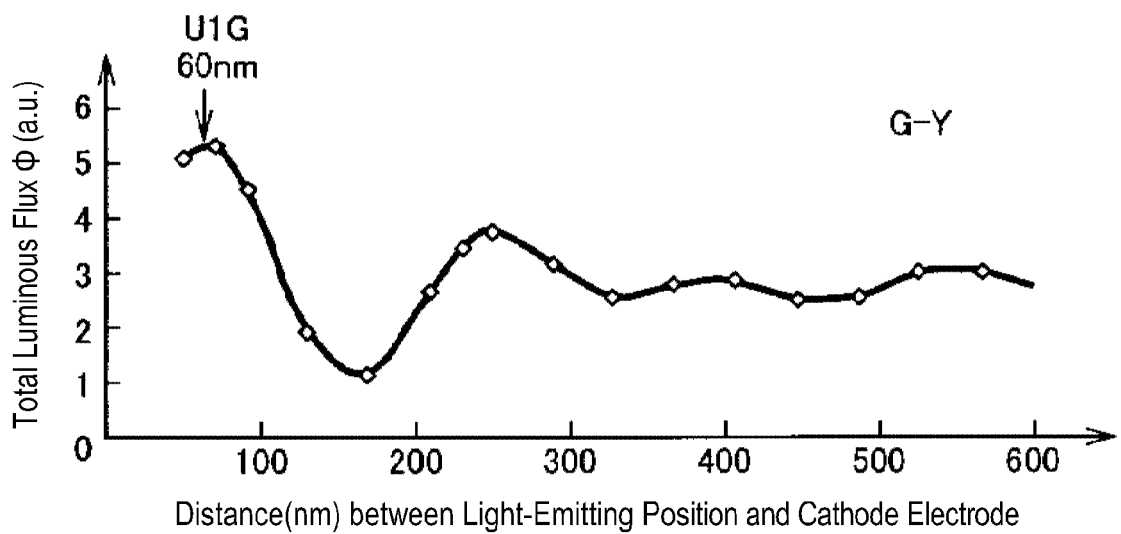
FIG. 17 is a view representing the relationship of the total luminous flux ø in a case of greenish yellow light emission with the distance L between the light-emitting position and the negative electrode in the organic EL device having the thin MPE structure according to the third embodiment.
Figure 18:
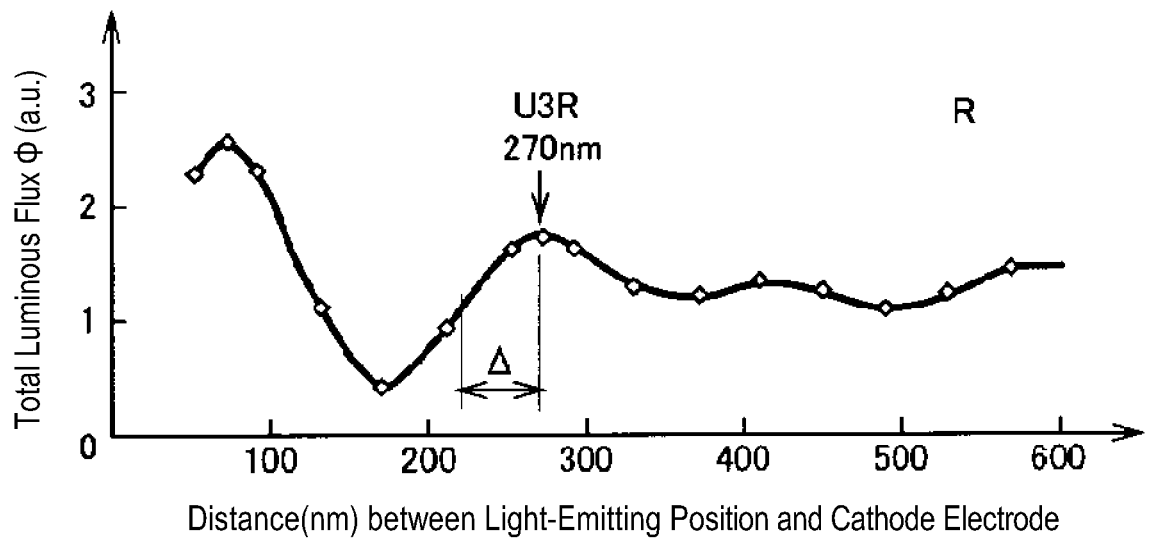
FIG. 18 is a view representing the relationship of the total luminous flux ø in a case of red light emission with the distance L between the light-emitting position and the negative electrode in the organic EL device having the thin MPE structure according to the third embodiment.

In the organic EL device 1 having the thin MPE structure according to the third embodiment, the relationship of the total luminous flux ø in a case of blue (B) light emission with the distance L between the light-emitting position and the second electrode (cathode electrode) 20 is shown in FIG. 16. The relationship of the total luminous flux ø in a case of greenish yellow (G-Y) light emission with the distance L between the light-emitting position and the cathode electrode is shown in FIG. 17. The relationship of the total luminous flux ø in a case of red (R) light emission with the distance L between the light-emitting position and the cathode electrode is shown in FIG. 18.

As shown in FIG. 17, a peak value of the total luminous flux ø becomes available when the distance L1 from the second electrode layer 20 to the center of the first organic emission layer $16_1$ of the first light-emitting unit U1G adjoining to the second electrode layer 20 is about 60 nm. As shown in FIG. 16, a peak value of the total luminous flux ø becomes available when the distance L2 from the second electrode layer 20 to the center of the second organic emission layer $16_2$ of the second light-emitting unit U2B adjoining to the first light-emitting unit U1G is about 220 nm. As shown in FIG. 18, a peak value of the total luminous flux ø becomes available when the distance L3 from the second electrode layer 20 to the center of the third organic emission layer $16_3$ of the third light-emitting unit U3R adjoining to the second light-emitting unit U2B is about 270 nm. Since a difference Δ between the distance L2 of the second light-emitting unit U2B and the distance L3 of the third light-emitting unit U3R is approximately 50 nm, it becomes possible to set the light-emitting units U1G, U2B and U3R in the above-noted manner.

In the organic EL device 1 having the thin MPE structure according to the third embodiment, the total thickness $L_t$ of the layers interposed between the first electrode layer 12 and the second electrode layer 20 can be set equal to or less than 360 nm.

With the third embodiment, it is possible to provide a bottom-emission-type organic EL device having the thin MPE structure, which is capable of optimizing the MPE structure and realizing cost reduction and high power efficiency.

<Fourth Embodiment>

Figure 5:
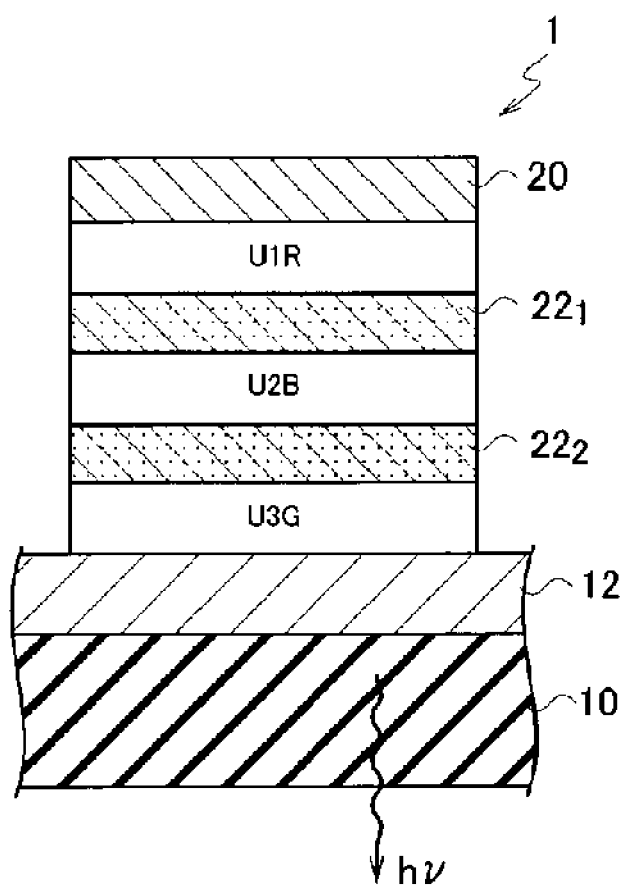
FIG. 5 is a schematic cross-sectional structure view showing an organic EL device having a thin MPE structure according to a fourth embodiment.

A schematic cross-sectional structure of an organic EL device 1 having a thin MPE structure according to a fourth embodiment is shown in FIG. 5. In the organic EL device 1 having the thin MPE structure according to the fourth embodiment, the peak of an emission wavelength of the first light-emitting unit U1R adjoining to the second electrode layer 20 among the light-emitting units U1G, U2B and U3R is from 550 nm to 700 nm. The peak of an emission wavelength of the second light-emitting unit U2B adjoining to the first light-emitting unit U1R is from 400 nm to 500 nm. The peak of an emission wavelength of the third light-emitting unit U3G adjoining to the second light-emitting unit U2B is from 500 nm to 600 nm. Other configurations remain the same as the configurations of the first embodiment or the second embodiment. Therefore, in the interest of brevity, description will not be repeated.

Figure 19:
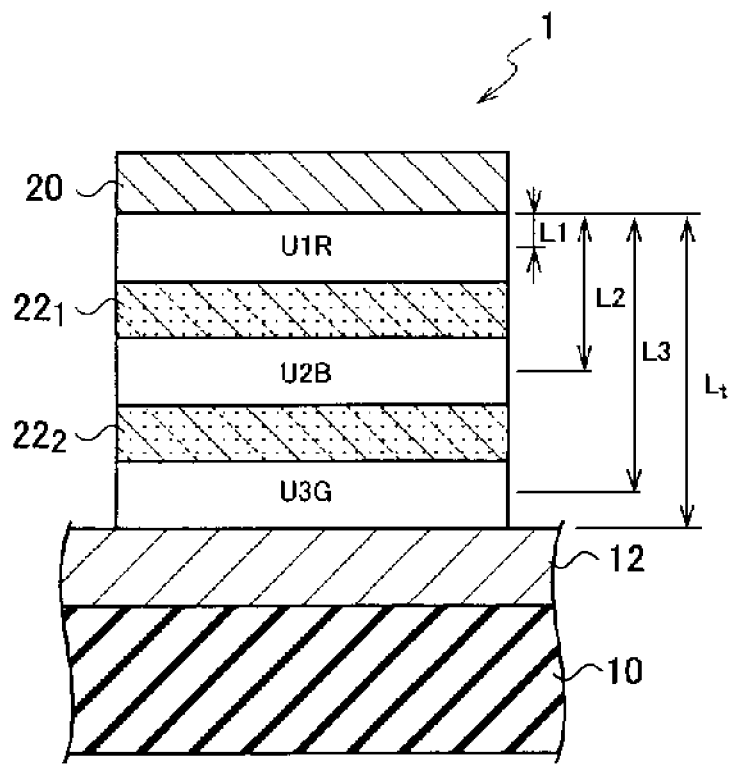
FIG. 19 is a schematic cross-sectional structure view for illustrating the light-emitting position where the total luminous flux of the respective colors becomes greatest in the organic EL device having the thin MPE structure according to the fourth embodiment.

A schematic cross-sectional structure for illustrating the light-emitting position where the total luminous flux of the respective colors becomes greatest in the organic EL device 1 having a thin MPE structure according to the fourth embodiment is shown in FIG. 19.

Figure 20:
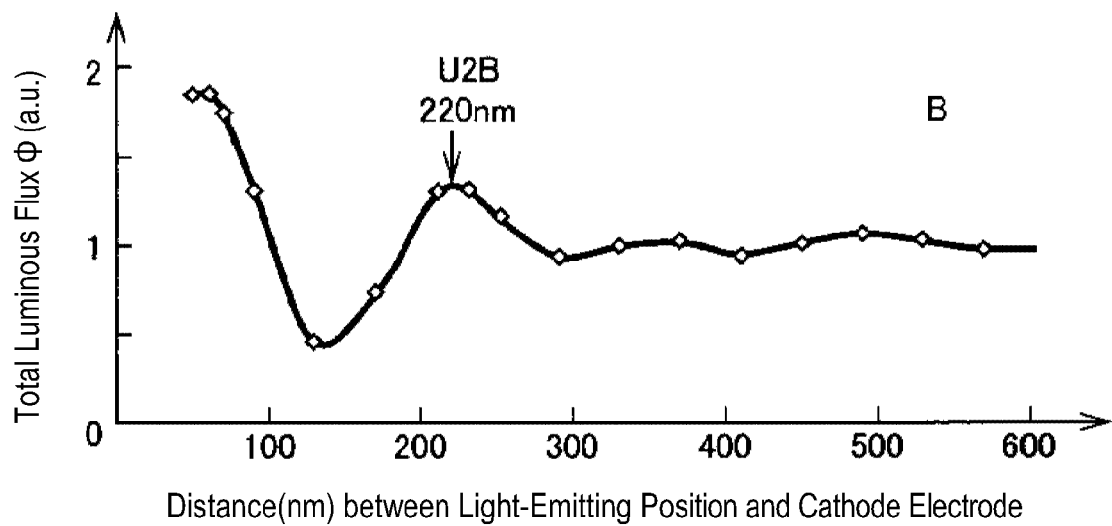
FIG. 20 is a view representing the relationship of the total luminous flux ø in a case of blue light emission with the distance L between the light-emitting position and the negative electrode in the organic EL device having the thin MPE structure according to the fourth embodiment.
Figure 21:
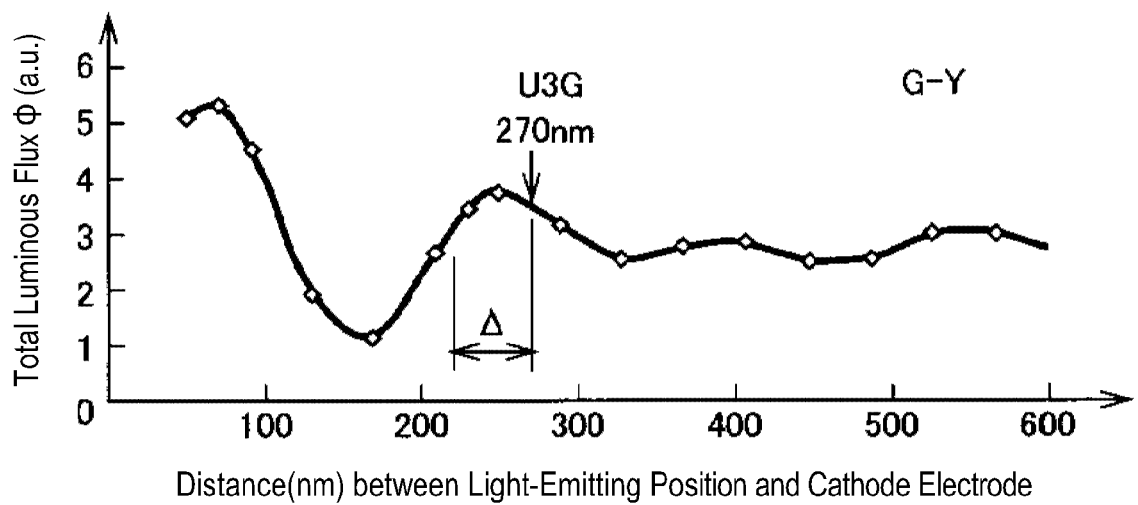
FIG. 21 is a view representing the relationship of the total luminous flux ø in a case of greenish yellow light emission with the distance L between the light-emitting position and the negative electrode in the organic EL device having the thin MPE structure according to the fourth embodiment.

In the organic EL device 1 having a thin MPE structure according to the fourth embodiment, the relationship of the total luminous flux ø in a case of blue (B) light emission with the distance L between the light-emitting position and the second electrode (cathode electrode) 20 is shown in FIG. 20. The relationship of the total luminous flux ø in a case of greenish yellow (G-Y) light emission with the distance L between the light-emitting position and the cathode electrode is shown in FIG. 21. The relationship of the total luminous flux ø in a case of red (R) light emission with the distance L between the light-emitting position and the cathode electrode is shown in FIG. 22.

Figure 22:
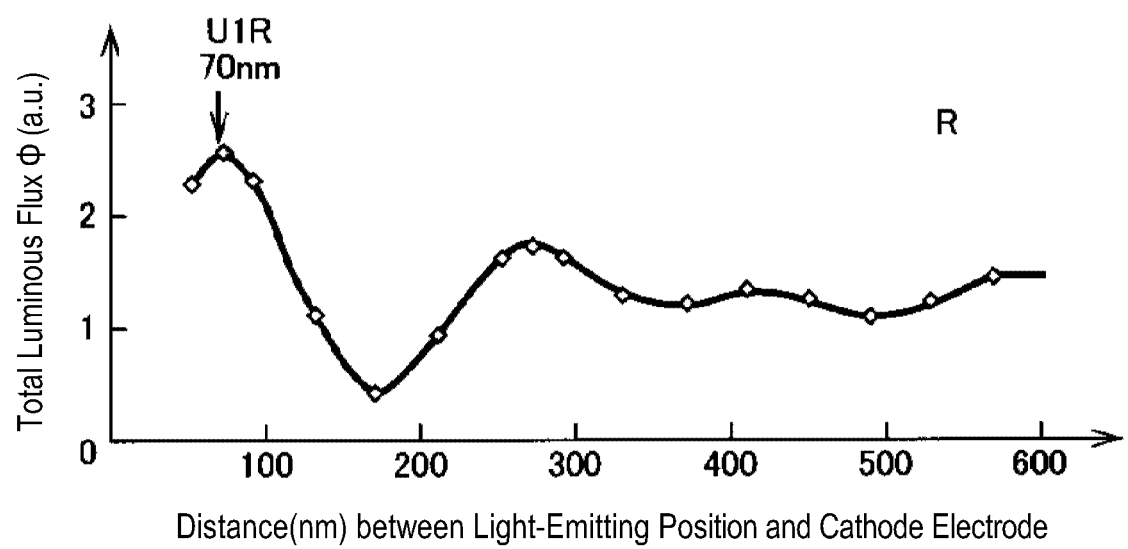
FIG. 22 is a view representing the relationship of the total luminous flux ø in a case of red light emission with the distance L between the light-emitting position and the negative electrode in the organic EL device having the thin MPE structure according to the fourth embodiment.

As shown in FIG. 22, a peak value of the total luminous flux ø becomes available when the distance L1 from the second electrode layer 20 to the center of the first organic emission layer $16_1$ of the first light-emitting unit U1R adjoining to the second electrode layer 20 is about 70 nm. As shown in FIG. 20, a peak value of the total luminous flux ø becomes available when the distance L2 from the second electrode layer 20 to the center of the second organic emission layer $16_2$ of the second light-emitting unit U2B adjoining to the first light-emitting unit U1R is about 220 nm. As shown in FIG. 21, a value close to the peak of the total luminous flux ø becomes available when the distance L3 from the second electrode layer 20 to the center of the third organic emission layer $16_3$ of the third light-emitting unit U3G adjoining to the second light-emitting unit U2B is about 270 nm. While the distance L2 and the distance L3 are slightly deviated from the peak value of the total luminous flux ø as shown in FIG. 21, a difference Δ between the distance L2 and the distance L3 can be set equal to about 50 nm.

In the organic EL device 1 having the thin MPE structure according to the fourth embodiment, the total thickness $L_t$ of the layers interposed between the first electrode layer 12 and the second electrode layer 20 can be set equal to or less than 360 nm.

With the fourth embodiment, it is possible to provide a bottom-emission-type organic EL device having the thin MPE structure, which is capable of optimizing the MPE structure and realizing cost reduction and high power efficiency.

In the organic EL devices having the thin MPE structure according to the embodiments, the relationship of the combinations of emission colors in the light-emitting units U1, U2 and U3 with the distance L between the light-emitting position and the cathode electrode corresponding to these combinations can be collectively indicated as shown in FIG. 23. Those cases where double emission layers are employed are also included in FIG. 23. For example, BR indicates an example where a blue (B) emission layer and a red (R) emission layer are formed one above the other within a single light-emitting unit. BG indicates an example where a blue (B) emission layer and a green (G) emission layer are formed one above the other within a single light-emitting unit. GR indicates an example where a green (G) emission layer and a red (R) emission layer are formed one above the other within a single light-emitting unit.

<Fifth Embodiment>

Figure 24:
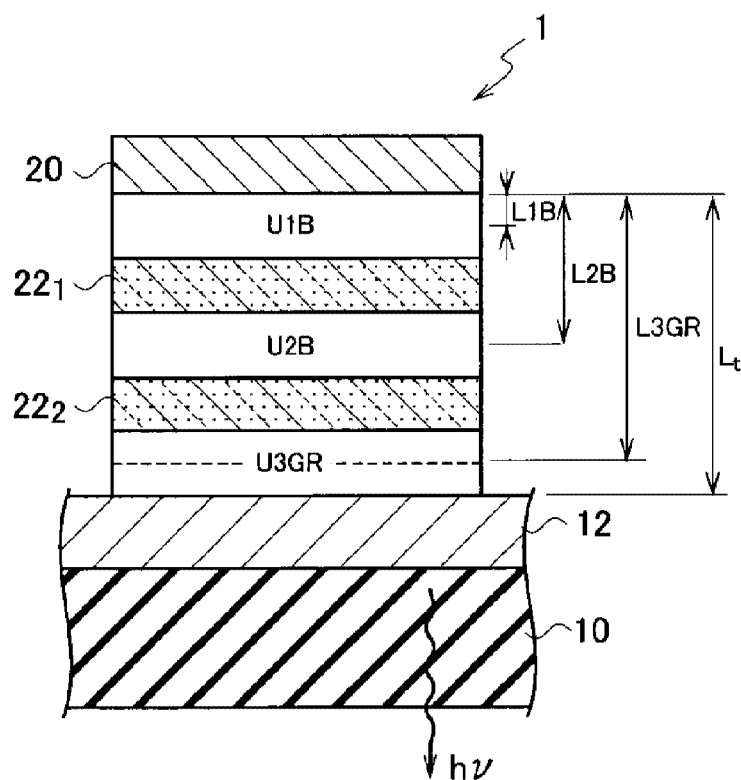
FIG. 24 is a schematic cross-sectional structure view for illustrating the light-emitting position where the total luminous flux of the respective colors becomes greatest in the organic EL device having a thin MPE structure according to a fifth embodiment.

A schematic cross-sectional structure of an organic EL device 1 having a thin MPE structure according to a fifth embodiment is shown in FIG. 24. In the organic EL device 1 having the thin MPE structure according to the fifth embodiment, the peak of an emission wavelength of the first light-emitting unit U1B adjoining to the second electrode layer 20 among the light-emitting units U1G, U2B and U3R may be from 400 nm to 500 nm. The peak of an emission wavelength of the second light-emitting unit U2B adjoining to the first light-emitting unit U1B may be from 400 nm to 500 nm. The peak of an emission wavelength of the third light-emitting unit U3GR adjoining to the second light-emitting unit U2B may be from 500 nm to 700 nm. Other configurations remain the same as the configurations of the first embodiment or the second embodiment. Therefore, the description to these configurations will not be repeated.

A schematic cross-sectional structure for illustrating the light-emitting position where the total luminous flux of the respective colors becomes greatest in the organic EL device 1 having the thin MPE structure according to the fifth embodiment is shown in FIG. 24.

Figure 25:
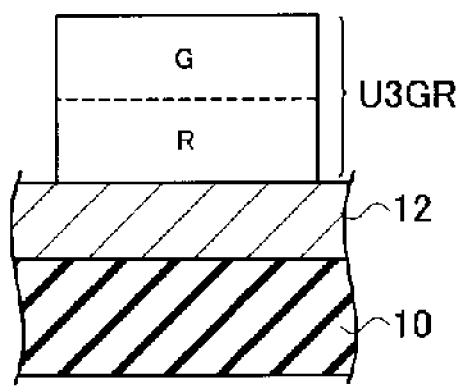
FIG. 25 is a schematic cross-sectional structure view for illustrating an example in which the third light-emitting unit U3 has double light-emitting layers in the organic EL device having the thin MPE structure according to the fifth embodiment.

In the organic EL device 1 having the thin MPE structure according to the fifth embodiment, the configuration within the third light-emitting unit U3GR may be a double-emission-layer structure as shown in FIG. 25. In the case of the double-emission-layer structure, it is preferred that an emission layer having a shorter emission wavelength be positioned at the side of the second electrode layer 20. In FIG. 25, there is shown a configuration in which a red (R) emission layer as the third light-emitting unit U3 is arranged on the first electrode layer 12 and in which a green (G) emission layer is formed on the red (R) emission layer. An emission layer made of a mixture of a red emission material and a green emission material may be formed, as the third light-emitting unit U3, on the first electrode layer 12.

Figure 26:
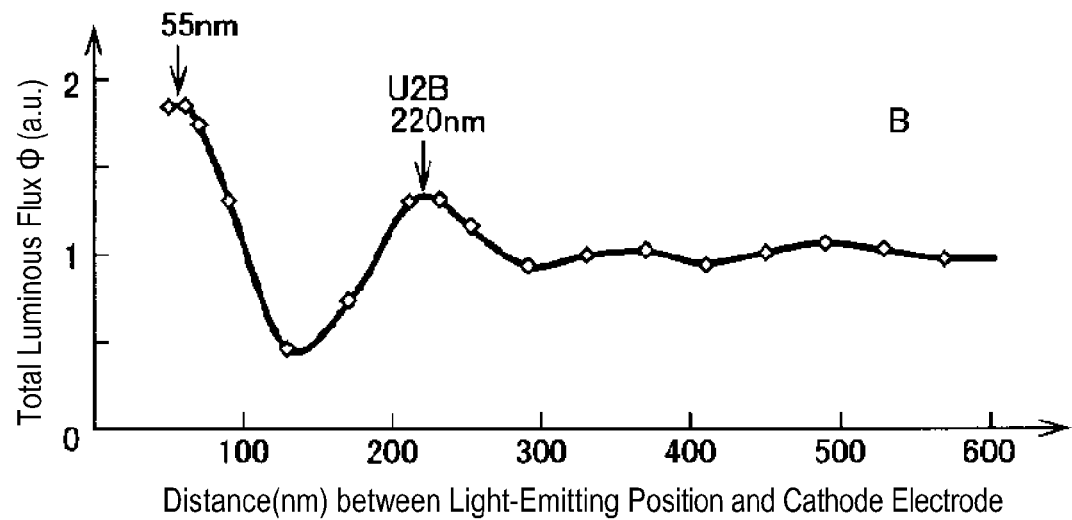
FIG. 26 is a view representing the relationship of the total luminous flux ø in a case of blue light emission with the distance L between the light-emitting position and the negative electrode in the organic EL device having the thin MPE structure according to the fifth embodiment.
Figure 27:
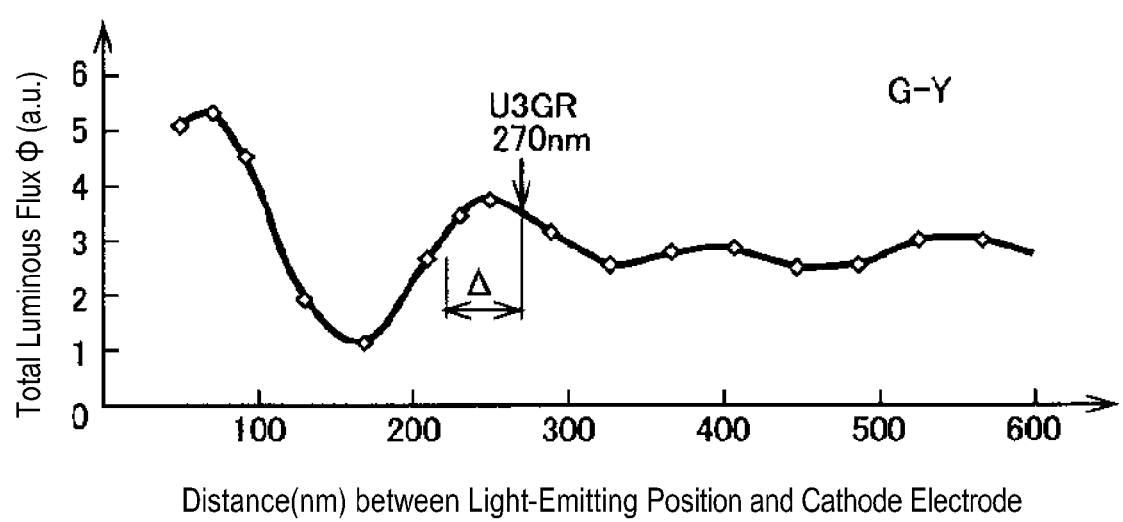
FIG. 27 is a view representing the relationship of the total luminous flux ø in a case of greenish yellow light emission with the distance L between the light-emitting position and the negative electrode in the organic EL device having the thin MPE structure according to the fifth embodiment.
Figure 28:
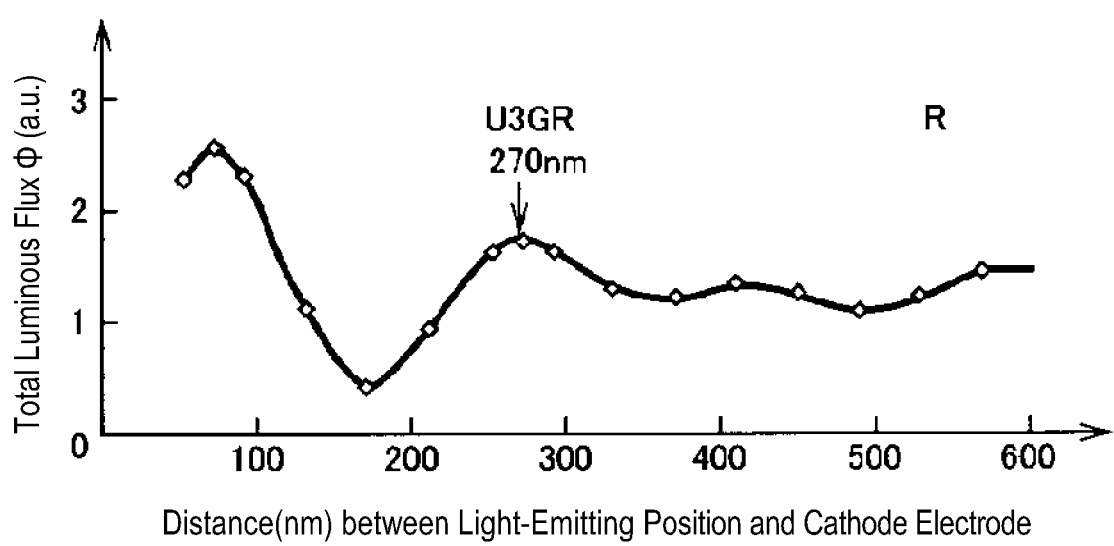
FIG. 28 is a view representing the relationship of the total luminous flux ø in a case of red light emission with the distance L between the light-emitting position and the negative electrode in the organic EL device having the thin MPE structure according to the fifth embodiment.

In the organic EL device 1 having the thin MPE structure according to the fifth embodiment, the relationship of the total luminous flux ø in case of blue (B) light emission with the distance L between the light-emitting position and the second electrode (cathode electrode) 20 is shown in FIG. 26. The relationship of the total luminous flux ø in a case of greenish yellow (G-Y) light emission with the distance L between the light-emitting position and the cathode electrode is shown in FIG. 27. The relationship of the total luminous flux ø in a case of red (R) light emission with the distance L between the light-emitting position and the cathode electrode is shown in FIG. 28.

As shown in FIGS. 24 and 26, a peak value of the total luminous flux ø becomes available when the values of the distance L1B from the second electrode layer 20 to the center of the first organic emission layer $16_1$ of the first light-emitting unit U1B adjoining to the second electrode layer 20 is about 55 nm and 220 nm. As shown in FIG. 27, a value close to the peak of the total luminous flux ø becomes available when the distance L2B from the second electrode layer 20 to the center of the second organic emission layer $16_2$ of the second light-emitting unit U2B adjoining to the first light-emitting unit U1B is about 270 nm. As shown in FIG. 28, a value close to the peak of the total luminous flux ø becomes available when the distance L3GR from the second electrode layer 20 to the center of the third organic emission layer $16_3$ of the third light-emitting unit U3GR adjoining to the second light-emitting unit U2B is about 270 nm. While the distance L2B and the distance L3GR are slightly deviated from the peak value of the total luminous flux ø as shown in FIG. 27, the difference Δ between the distance L2B and the distance L3GR can be set equal to about 50 nm.

In the organic EL device 1 having a thin MPE structure according to the fifth embodiment, the total thickness $L_t$ of the layers interposed between the first electrode layer 12 and the second electrode layer 20 can be set equal to or less than 360 nm.

With the fifth embodiment, it is possible to provide a bottom-emission-type and double-emission-layer-type organic EL device having the thin MPE structure, which is capable of optimizing the MPE structure and realizing cost reduction and high power efficiency.

<Sixth Embodiment>

In the first through fifth embodiments, the positions of the organic emission layers and the positions of the charge generation layers are defined with respect to the organic EL devices having a thin MPE structure in which three or more light-emitting units U1 through Un are formed one above another. It will be appreciated that the present disclosure is not limited to the organic EL devices having a thin MPE structure in which three or more light-emitting units U1 through Un are formed one above another.

Figure 29:
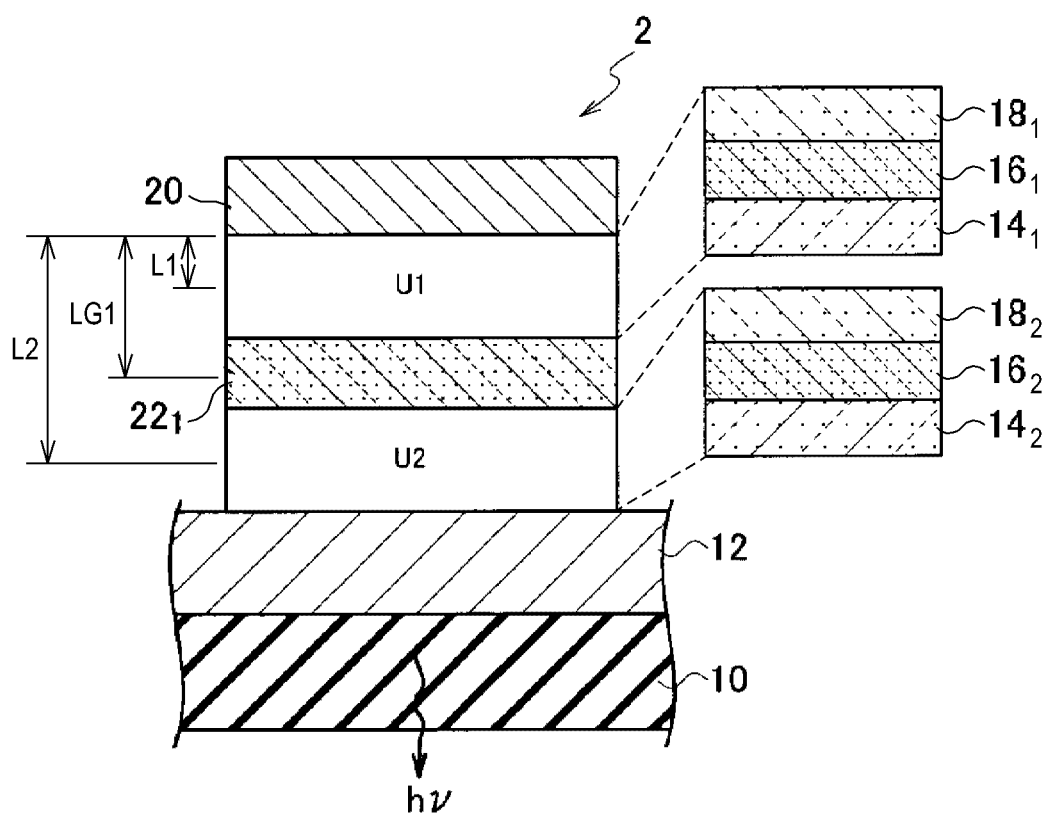
FIG. 29 is a schematic cross-sectional structure view showing an organic EL device having a thin MPE structure according to a sixth embodiment.

Referring to FIG. 29, there is shown a schematic cross-sectional structure of an organic EL device 2 having a thin MPE structure according to a sixth embodiment. The schematic cross-sectional structure shown in FIG. 29 defines an organic EL device 2 having the thin MPE structure in which two light-emitting units U1 and U2 are formed one above the other. The organic EL device 2 having the thin MPE structure according to the sixth embodiment is of a bottom emission type.

As shown in FIG. 29, the organic EL device 2 having the thin MPE structure according to the sixth embodiment includes a light-transmitting substrate 10, a light-transmitting first electrode layer 12 arranged on the substrate 10, first and second light-emitting units U1 and U2 layered and arranged on the first electrode layer 12, a charge generation layer $22_1$ interposed and arranged between the first and second light-emitting units U1 and U2 and a second electrode layer 20 arranged on the first light-emitting unit U1 positioned highest in the layering direction. Each of the first and second light-emitting units U1 and U2 includes a central organic emission layer $16_1$ or $16_2$, a hole transfer layer $14_1$ or $14_2$ and an electron transfer layer $18_1$ or $18_2$. The distance L1 from the second electrode layer 20 to the center of the first organic emission layer $16_1$ of the first light-emitting unit U1 adjoining to the second electrode layer 20 is from 30 nm to 90 nm. The distance L2 from the second electrode layer 20 to the center of the second organic emission layer $16_2$ of the second light-emitting unit U2 adjoining to the first light-emitting unit U1 is from 195 nm to 255 nm.

In the organic EL device 2 having the thin MPE structure according to the sixth embodiment, as shown in FIG. 29, the distance LG1 from the second electrode layer 20 to the center of the charge generation layer $22_1$ arranged between the first and second light-emitting units U1 and U2 may be from 60 nm to 225 nm.

Each of the first and second light-emitting units U1 and U2 includes a central organic emission layer $16_1$ or $16_2$, a hole transfer layer $14_1$ or $14_2$ and an electron transfer layer $18_1$ or $18_2$. These layers may be arranged, for example, in the order of the hole transfer layer $14_1$ or $14_2$, the organic emission layer $16_1$ or $16_2$ and the electron transfer layer $18_1$ or $18_2$ or in the order of the electron transfer layer $18_1$ or $18_2$, the organic emission layer $16_1$ or $16_2$ and the hole transfer layer $14_1$ or $14_2$ for each of the light-emitting units U1 and U2, from the first electrode layer 12 toward the second electrode layer 20. In other words, the layering order can be appropriately selected depending on the polarity of a bias voltage applied between the first electrode layer 12 and the second electrode layer 20.

Other configurations remain the same as the configurations of the organic EL device 1 according to the first embodiment which has the MPE structure of three units or more. Therefore, this same description will not be repeated.

With the sixth embodiment, it is possible to provide a bottom-emission-type organic EL device having the thin MPE structure, which is capable of optimizing the two-unit MPE structure and realizing cost reduction and high power efficiency.

<Seventh Embodiment>

In the structure shown in FIG. 29, one of the first and second light-emitting units U1 and U2 may include multiple organic emission layers.

Figure 30:
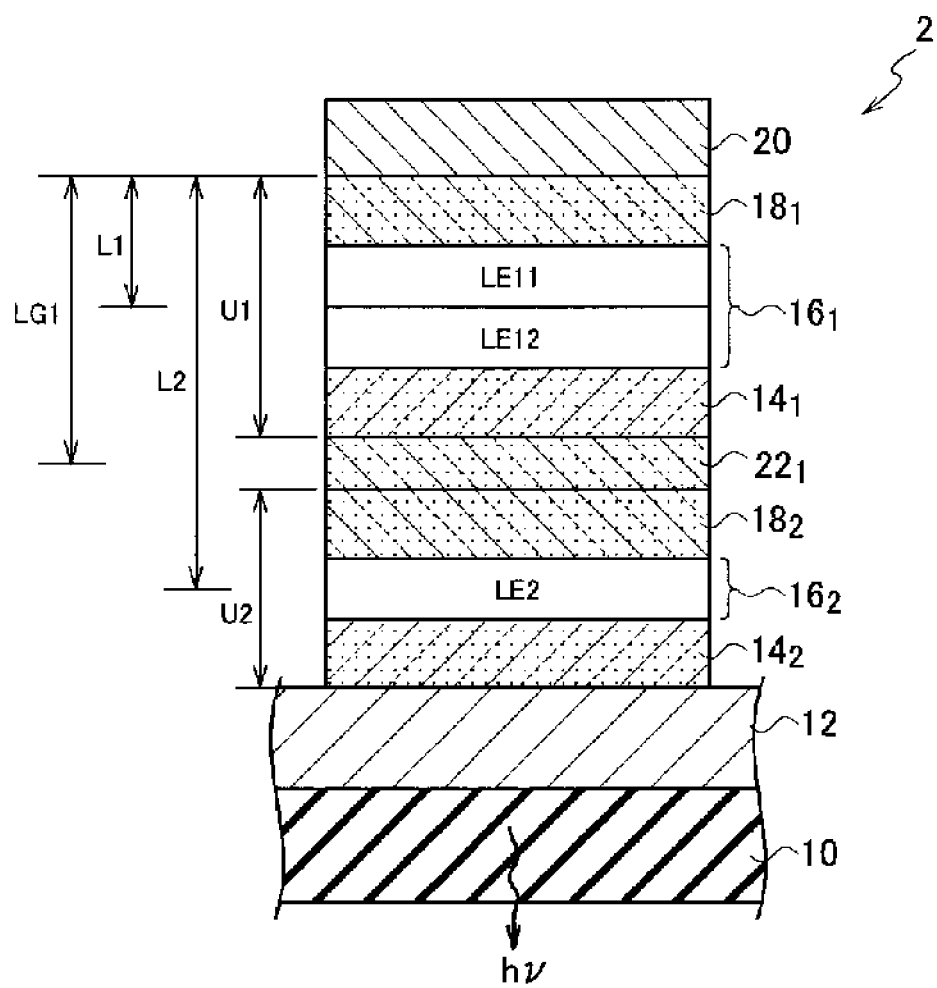
FIG. 30 is a schematic cross-sectional structure view showing an organic EL device having a thin MPE structure according to a seventh embodiment.

Referring to FIG. 30, there is shown a schematic cross-sectional structure of an organic EL device 2 having a thin MPE structure according to a seventh embodiment. In the schematic cross-sectional structure of the organic EL device 2 shown in FIG. 30, the first organic emission layer $16_1$ of the first light-emitting unit U1 of the two light-emitting units U1 and U2 includes multiple organic emission layers LE11 and LE12. Among the multiple organic emission layers LE11 and LE12, the organic emission layer LE11 having a relatively short emission wavelength is arranged near the second electrode layer 20. This is because, as is apparent in FIGS. 7 through 9, the positions of the emission layers for obtaining higher total luminous flux are shifted toward the second electrode layer 20 as the emission wavelengths of the emission layers grow shorter. The organic EL device 2 having the thin MPE structure according to the seventh embodiment is of a bottom emission type.

As shown in FIG. 30, the organic EL device 2 having the thin MPE structure according to the seventh embodiment includes a light-transmitting substrate 10, a light-transmitting first electrode layer 12 arranged on the substrate 10, first and second light-emitting units U1 and U2 layered and arranged on the first electrode layer 12, a charge generation layer $22_1$ interposed and arranged between the first and second light-emitting units U1 and U2 and a second electrode layer 20 arranged on the first light-emitting unit U1 positioned highest in the layering direction. The first light-emitting unit U1 includes central multiple organic emission layers $16_1$ (LE11 and LE12), a hole transfer layer $14_1$ and an electron transfer layer $18_1$. The second light-emitting unit U2 includes a central organic emission layer $16_2$, a hole transfer layer $14_2$ and an electron transfer layer $18_2$. The distance L1 from the second electrode layer 20 to the center of the multiple organic emission layers $16_1$ (LE11 and LE12) of the first light-emitting unit U1 adjoining to the second electrode layer 20 is from 30 nm to 90 nm. The distance L2 from the second electrode layer 20 to the center of the second organic emission layer $16_2$ of the second light-emitting unit U2 adjoining to the first light-emitting unit U1 is from 195 nm to 255 nm.

In the organic EL device 2 having the thin MPE structure according to the seventh embodiment, the distance LG1 from the second electrode layer 20 to the center of the charge generation layer $22_1$ arranged between the first and second light-emitting units U1 and U2 may be from 60 nm to 225 nm.

Each of the first and second light-emitting units U1 and U2 includes a central organic emission layer $16_1$ or $16_2$, a hole transfer layer $14_1$ or $14_2$ and an electron transfer layer $18_1$ or $18_2$. These layers may be arranged, for example, in the order of the hole transfer layer $14_1$ or $14_2$, the organic emission layer $16_1$ or $16_2$ and the electron transfer layer $18_1$ or $18_2$ or in the order of the electron transfer layer $18_1$ or $18_2$, the organic emission layer $16_1$ or $16_2$ and the hole transfer layer $14_1$ or $14_2$ for each of the light-emitting units U1 and U2, from the first electrode layer 12 toward the second electrode layer 20. In other words, the layering order can be appropriately selected depending on the polarity of a bias voltage applied between the first electrode layer 12 and the second electrode layer 20.

Figures 31, 32:
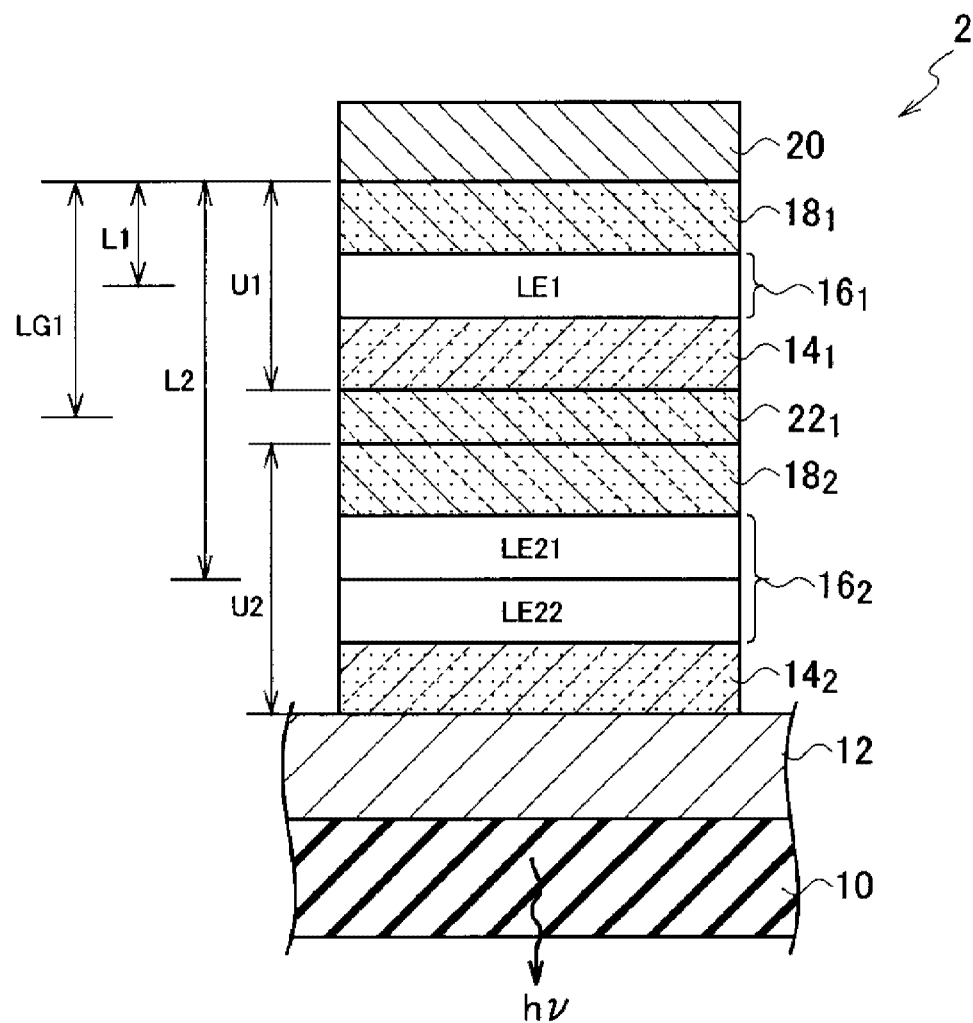
FIG. 31 is a view representing the combination of emission colors in the organic EL device having the thin MPE structure according to the seventh embodiment.
FIG. 32 is a schematic cross-sectional structure view showing an organic EL device having a thin MPE structure according to a first modified example of the seventh embodiment.

In the organic EL device 2 having the thin MPE structure according to the seventh embodiment, the combinations of emission colors in the light-emitting units U1 and U2 can be indicated as shown in FIG. 31.

In FIG. 31, it may be possible to employ, for example, a hybrid system in which a luminescence material is applied to the blue (B) emission layer and in which a phosphorescence material is applied to the green (G) emission layer and the red (R) emission layer.

The internal quantum efficiency outputted per single light-emitting unit has an upper limit of 100% (about 25% in case of a luminescence emission material). If light beams of multiple colors are emitted within a single light-emitting unit, the internal quantum efficiency is distributed to the respective colors. In case of the hybrid system (in which a luminescence material is applied to the blue (B) emission layer and in which a phosphorescence material is applied to the green (G) emission layer and the red (R) emission layer), it is therefore not advisable to combine the blue (B) emission layer with the emission layers of other colors. Accordingly, in case of the hybrid system, combination example 1 in which the blue (B) emission layer made of a luminescence material is independently applied to the second light-emitting unit U2 becomes the most suitable color scheme structure.

The phosphorescence material may be applied not only to the green (G) emission layer and the red (R) emission layer but also to the blue (B) emission layer.

Other configurations remain the same as the configurations of the organic EL device 1 according to the first embodiment which has the MPE structure of three units or more. Therefore, these descriptions will not be repeated.

<First Modified Example>

In the structure shown in FIG. 29, one of the first and second light-emitting units U1 and U2 may include multiple organic emission layers.

Referring to FIG. 32, there is shown a schematic cross-sectional structure of an organic EL device 2 having a thin MPE structure according to a first modified example of the seventh embodiment. In the schematic cross-sectional structure of the organic EL device 2 shown in FIG. 32, the second organic emission layer $16_2$ of the second light-emitting unit U2 includes multiple organic emission layers LE21 and LE22. Among the multiple organic emission layers LE21 and LE22, the organic emission layer LE21 having a relatively short emission wavelength is arranged near the second electrode layer 20. This is because, as is apparent in FIGS. 7 through 9, the positions of the emission layers for obtaining higher total luminous flux are shifted toward the second electrode layer 20 as the emission wavelengths of the emission layers grow shorter. The organic EL device 2 having the thin MPE structure according to the first modified example of the seventh embodiment is of a bottom emission type.

As shown in FIG. 32, the organic EL device 2 having the thin MPE structure according to the first modified example of the seventh embodiment includes a light-transmitting substrate 10, a light-transmitting first electrode layer 12 arranged on the substrate 10, first and second light-emitting units U1 and U2 layered and arranged on the first electrode layer 12, a charge generation layer $22_1$ interposed and arranged between the first and second light-emitting units U1 and U2 and a second electrode layer 20 arranged on the first light-emitting unit U1 positioned highest in the layering direction. The first light-emitting unit U1 includes a central organic emission layer $16_1$, a hole transfer layer $14_1$ and an electron transfer layer $18_1$. The second light-emitting unit U2 includes a central organic emission layer $16_2$ (LE21 and LE22), a hole transfer layer $14_2$ and an electron transfer layer $18_2$. The distance L1 from the second electrode layer 20 to the center of the first organic emission layer $16_1$ of the first light-emitting unit U1 adjoining to the second electrode layer 20 is from 30 nm to 90 nm. The distance L2 from the second electrode layer 20 to the center of the second organic emission layer $16_2$ (LE21 and LE22) of the second light-emitting unit U2 adjoining to the first light-emitting unit U1 is from 195 nm to 255 nm.

In the organic EL device 2 having the thin MPE structure according to the first modified example of the seventh embodiment, the distance LG1 from the second electrode layer 20 to the center of the charge generation layer $22_1$ arranged between the first and second light-emitting units U1 and U2 may be from 60 nm to 225 nm.

Each of the first and second light-emitting units U1 and U2 includes a central organic emission layer $16_1$ or $16_2$, a hole transfer layer $14_1$ or $14_2$ and an electron transfer layer $18_1$ or $18_2$. These layers may be arranged, for example, in the order of the hole transfer layer $14_1$ or $14_2$, the organic emission layer $16_1$ or $16_2$ and the electron transfer layer $18_1$ or $18_2$ or in the order of the electron transfer layer $18_1$ or $18_2$, the organic emission layer $16_1$ or $16_2$ and the hole transfer layer $14_1$ or $14_2$ in each of the light-emitting units U1 and U2, from the first electrode layer 12 toward the second electrode layer 20. In other words, the layering order can be appropriately selected depending on the polarity of a bias voltage applied between the first electrode layer 12 and the second electrode layer 20.

Figures 33, 34:
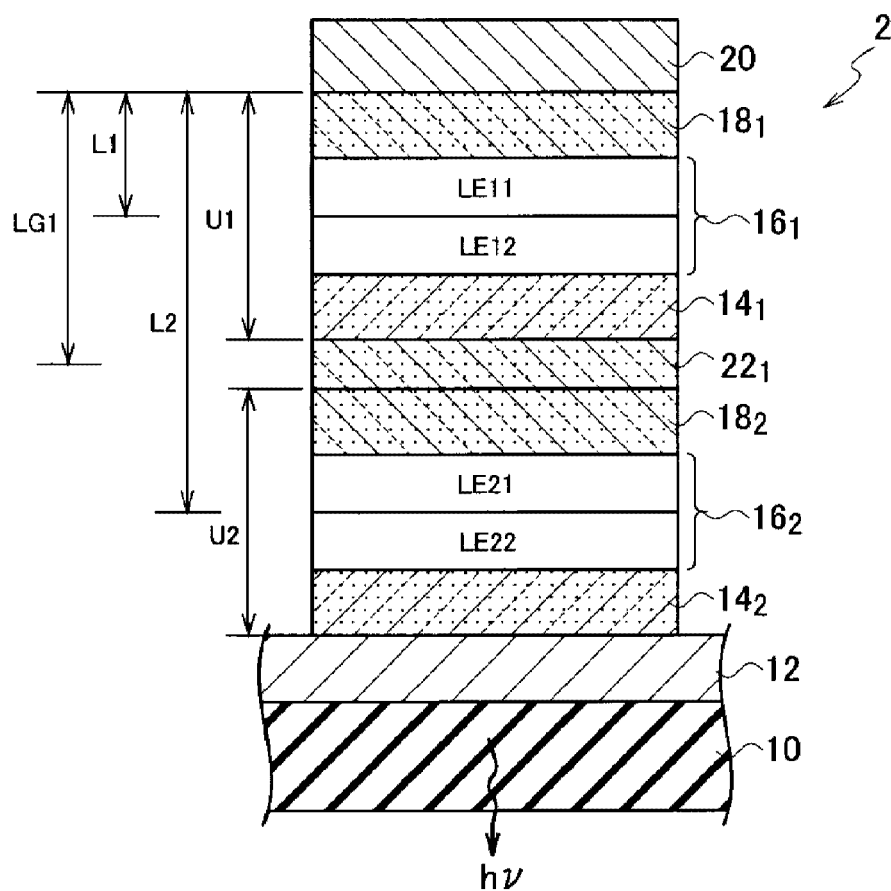
FIG. 33 is a view representing the combination of emission colors in the organic EL device having the thin MPE structure according to the first modified example of the seventh embodiment.
FIG. 34 is a schematic cross-sectional structure view showing an organic EL device having a thin MPE structure according to a second modified example of the seventh embodiment.

In the organic EL device 2 having the thin MPE structure according to the first modified example of the seventh embodiment, the combinations of emission colors in the light-emitting units U1 and U2 can be indicated as shown in FIG. 33.

In FIG. 33, it may be possible to employ, for example, a hybrid system in which a luminescence material is applied to the blue (B) emission layer and in which a phosphorescence material is applied to the green (G) emission layer and the red (R) emission layer.

The internal quantum efficiency outputted per single light-emitting unit has an upper limit of 100% (about 25% in case of a luminescence emission material). If light beams of multiple colors are emitted within a single light-emitting unit, the internal quantum efficiency is distributed to the respective colors. In case of the hybrid system (in which a luminescence material is applied to the blue (B) emission layer and in which a phosphorescence material is applied to the green (G) emission layer and the red (R) emission layer), it is therefore not advisable to combine the blue (B) emission layer with the emission layers of other colors. Accordingly, in case of the hybrid system, combination example 4 in which the blue (B) emission layer made of a luminescence material is independently applied to the first light-emitting unit U1 becomes the most suitable color scheme structure. The phosphorescence material may be applied not only to the green (G) emission layer and the red (R) emission layer but also to the blue (B) emission layer.

Other configurations remain the same as the configurations of the organic EL device 1 according to the first embodiment which has the MPE structure of three units or more. Therefore, the description of these configurations will not be repeated.

<Second Modified Example>

In the structure shown in FIG. 29, both of the first and second light-emitting units U1 and U2 may include multiple organic emission layers.

Referring to FIG. 34, there is shown a schematic cross-sectional structure of an organic EL device 2 having a thin MPE structure according to a second modified example of the seventh embodiment. In the schematic cross-sectional structure of the organic EL device 2 shown in FIG. 34, the first organic emission layer $16_1$ of the first light-emitting unit U1 includes multiple organic emission layers LE11 and LE12. The second organic emission layer $16_2$ of the second light-emitting unit U2 includes multiple organic emission layers LE21 and LE22. Among the multiple organic emission layers $16_1$ (LE11 and LE12) and the multiple organic emission layers $16_2$ (LE21 and LE22), the organic emission layers LE11 and LE21 having a relatively short emission wavelength are arranged near the second electrode layer 20. This is because, as is apparent in FIGS. 7 through 9, the positions of the emission layers for obtaining higher total luminous flux are shifted toward the second electrode layer 20 as the emission wavelengths of the emission layers grow shorter. The organic EL device 2 having the thin MPE structure according to the second modified example of the seventh embodiment is of a bottom emission type.

As shown in FIG. 34, the organic EL device 2 having the thin MPE structure according to the second modified example of the seventh embodiment includes a light-transmitting substrate 10, a light-transmitting first electrode layer 12 arranged on the substrate 10, first and second light-emitting units U1 and U2 layered and arranged on the first electrode layer 12, a charge generation layer $22_1$ interposed and arranged between the first and second light-emitting units U1 and U2 and a second electrode layer 20 arranged on the first light-emitting unit U1 positioned highest in the layering direction. The first light-emitting unit U1 includes central multiple organic emission layers $16_1$ (LE11 and LE12), a hole transfer layer $14_1$ and an electron transfer layer $18_1$. The second light-emitting unit U2 includes central multiple organic emission layers $16_2$ (LE21 and LE22), a hole transfer layer $14_2$ and an electron transfer layer $18_2$. The distance L1 from the second electrode layer 20 to the center of the multiple organic emission layers $16_1$ (LE11 and LE12) of the first light-emitting unit U1 adjoining to the second electrode layer 20 is from 30 nm to 90 nm. The distance L2 from the second electrode layer 20 to the center of the multiple organic emission layers $16_2$ (LE21 and LE22) of the second light-emitting unit U2 adjoining to the first light-emitting unit U1 is from 195 nm to 255 nm.

In the organic EL device 2 having the thin MPE structure according to the second modified example of the seventh embodiment, the distance LG1 from the second electrode layer 20 to the center of the charge generation layer $22_1$ arranged between the first and second light-emitting units U1 and U2 may be from 60 nm to 225 nm.

Each of the first and second light-emitting units U1 and U2 includes a central organic emission layer $16_1$ or $16_2$, a hole transfer layer $14_1$ or $14_2$ and an electron transfer layer $18_1$ or $18_2$. These layers may be arranged, for example, in the order of the hole transfer layer $14_1$ or $14_2$, the organic emission layer $16_1$ or $16_2$ and the electron transfer layer $18_1$ or $18_2$ or in the order of the electron transfer layer $18_1$ or $18_2$, the organic emission layer $16_1$ or $16_2$ and the hole transfer layer $14_1$ or $14_2$ for each of the light-emitting units U1 and U2, from the first electrode layer 12 toward the second electrode layer 20. In other words, the layering order can be appropriately selected depending on the polarity of a bias voltage applied between the first electrode layer 12 and the second electrode layer 20.
<Concrete Examples>

Figure 35:
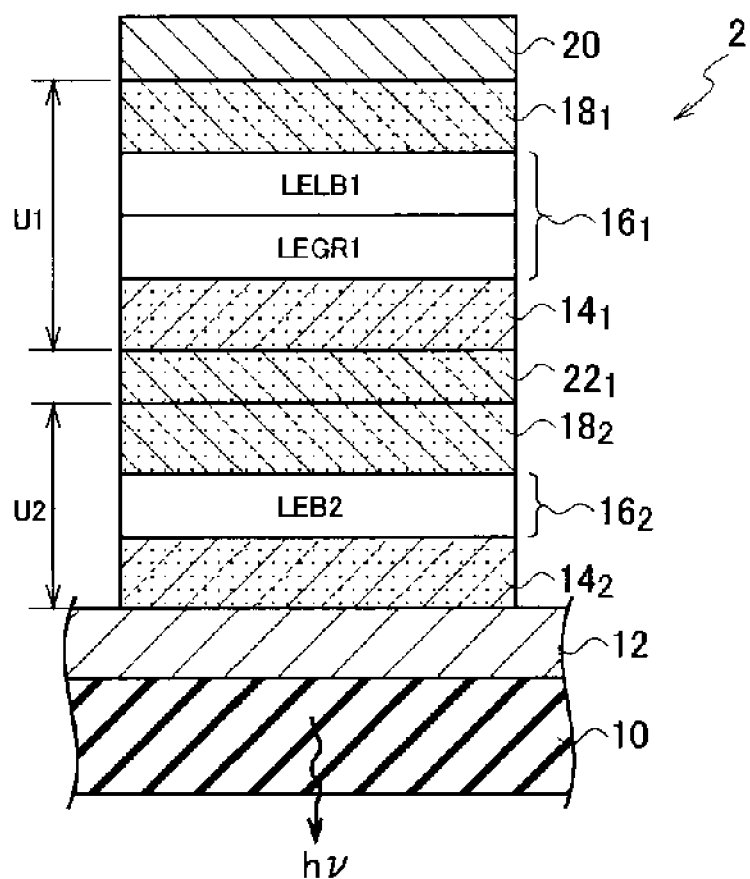
FIG. 35 is a schematic cross-sectional structure view showing an organic EL device having a thin MPE structure according to a first concrete example of the seventh embodiment.

A concrete example of the organic EL device 2 having the thin MPE structure according to the first modified example of the seventh embodiment is shown in FIG. 35.

In FIG. 35, the multiple organic emission layers $16_1$ of the first light-emitting unit U1 include a light blue emission layer LELB1 and a greenish red emission layer LEGR1. The organic emission layer $16_2$ of the second light-emitting unit U2 includes a blue emission layer LEB2. The greenish red emission layer LEGR1 is formed by dispersing two kinds of light-emitting materials within a single emission layer. In the example shown in FIG. 35, the number of the light-emitting materials is four and the number of the emission layers is three.

Figure 36:
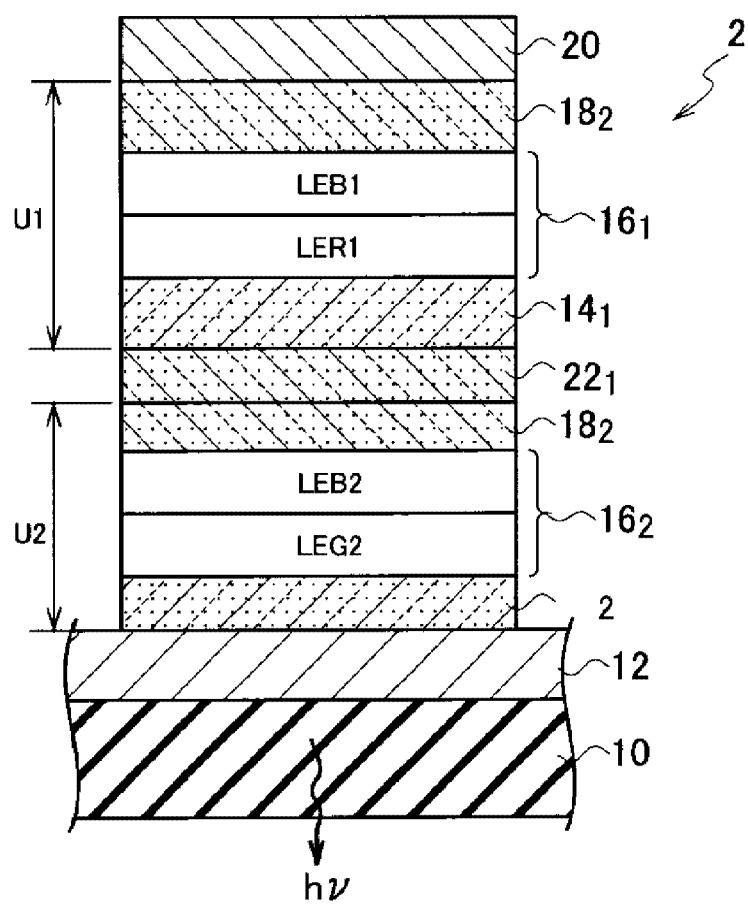
FIG. 36 is a schematic cross-sectional structure view showing an organic EL device having a thin MPE structure according to a second concrete example of the seventh embodiment.
Figure 37:
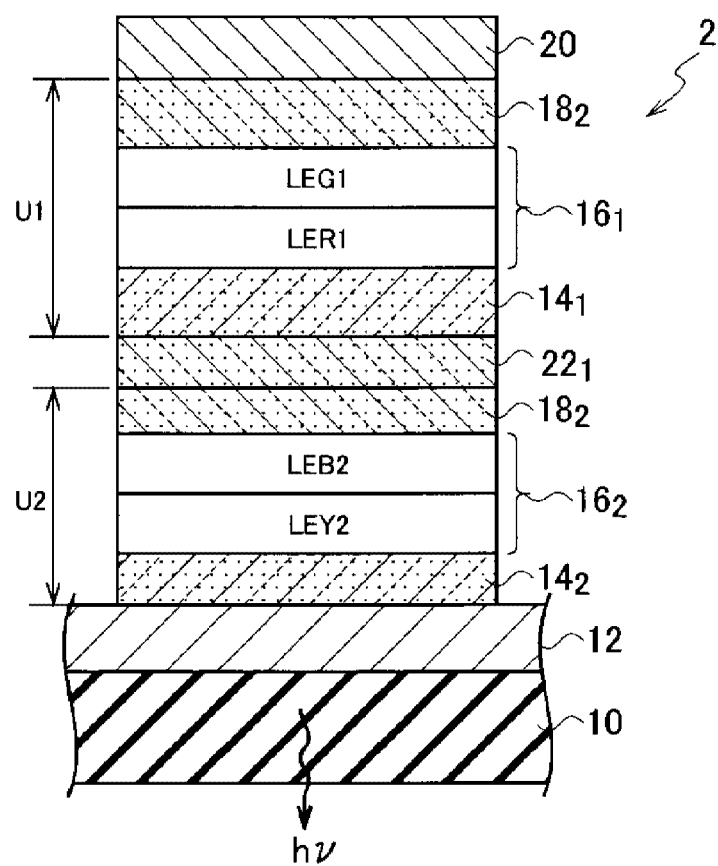
FIG. 37 is a schematic cross-sectional structure view showing an organic EL device having a thin MPE structure according to a third concrete example of the seventh embodiment.
Figure 38:
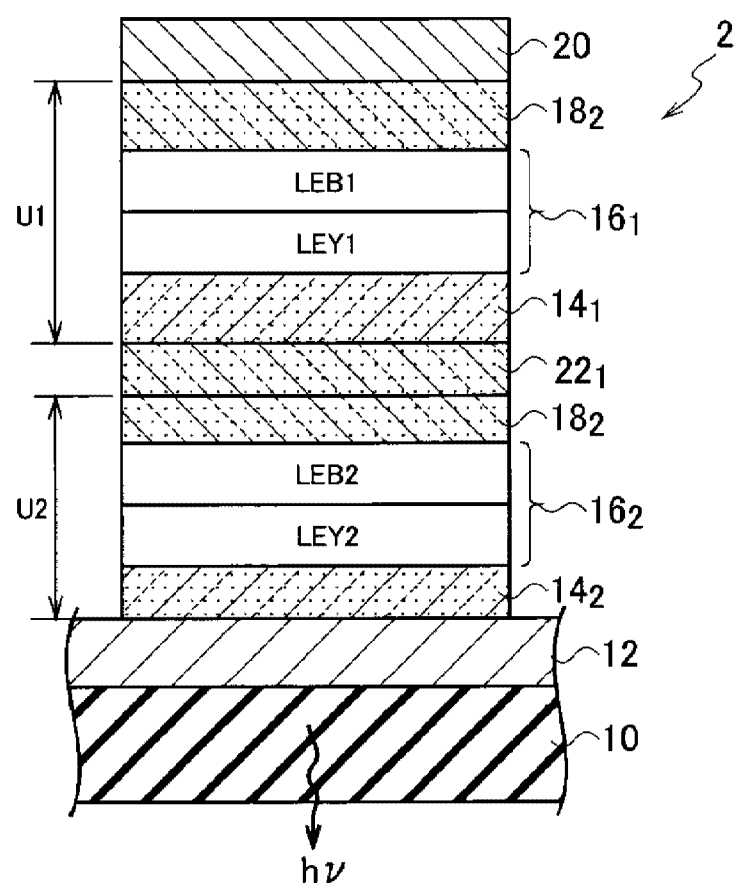
FIG. 38 is a schematic cross-sectional structure view showing an organic EL device having a thin MPE structure according to a fourth concrete example of the seventh embodiment.

In the organic EL device 2 having the thin MPE structure according to the second modified example of the seventh embodiment, the combinations of emission colors in the first and second light-emitting units U1 and U2 can be depicted as shown in FIGS. 36 through 38.

In FIG. 36, the multiple organic emission layers $16_1$ of the first light-emitting unit U1 include a blue emission layer LEB1 and a red emission layer LER1. The multiple organic emission layers $16_2$ of the second light-emitting unit U2 include a blue emission layer LEB2 and a green emission layer LEG2. In the example shown in FIG. 36, the number of the light-emitting materials is three and the number of the emission layers is four.

In FIG. 37, the multiple organic emission layers $16_1$ of the first light-emitting unit U1 include a green emission layer LEG1 and a red emission layer LER1. The multiple organic emission layers $16_2$ of the second light-emitting unit U2 include a blue emission layer LEB2 and a yellow emission layer LEY2. In the example shown in FIG. 37, the number of the light-emitting materials is four and the number of the emission layers is four.

In FIG. 38, the multiple organic emission layers $16_1$ of the first light-emitting unit U1 include a blue emission layer LEB1 and a yellow emission layer LEY1. The multiple organic emission layers $16_2$ of the second light-emitting unit U2 include a blue emission layer LEB2 and a yellow emission layer LEY2. In the example shown in FIG. 38, the number of the light-emitting materials is two and the number of the emission layers is four.

In the organic EL device 2 having the thin MPE structure according to the second modified example of the seventh embodiment, it may be possible to employ, for example, a hybrid system in which a luminescence material is applied to the blue (B) emission layer and in which a phosphorescence material is applied to the green (G) emission layer and the red (R) emission layer. Alternatively, it is also be possible to apply a phosphorescence material to the blue (B) emission layer, the green (G) emission layer and the red (R) emission layer.

Other configurations remain the same as the configurations of the organic EL device 1 according to the first embodiment which has the MPE structure of three units or more. Therefore, the description to these other configurations will not be repeated.

With the seventh embodiment and the first and second modified examples thereof, it is possible to provide a bottom-emission-type organic EL device having the thin MPE structure, which is capable of optimizing the two-unit MPE structure and realizing cost reduction and high power efficiency.
<Eighth Embodiment>

In the first through fifth embodiments, the positions of the organic emission layers and the positions of the charge generation layers are defined with respect to the organic EL devices having the thin MPE structure in which three or more light-emitting units U1 through Un are formed one above another. However, the present disclosure is not limited to the organic EL devices having the thin MPE structure in which three or more light-emitting units U1 through Un are formed one above another.

Figure 39:
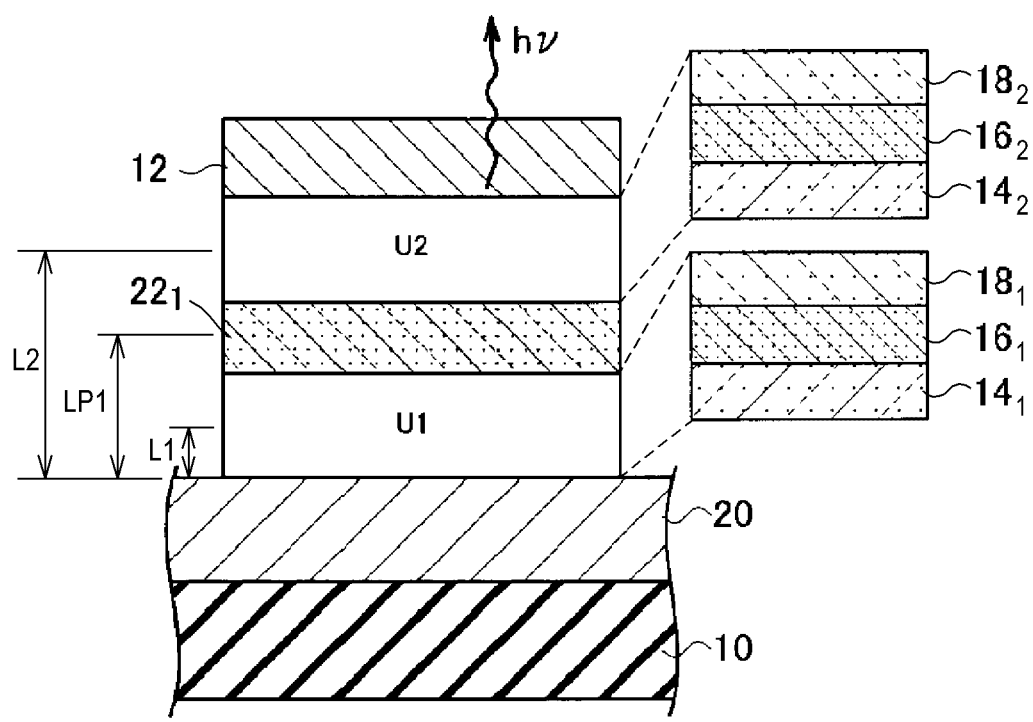
FIG. 39 is a schematic cross-sectional structure view showing an organic EL device having a thin MPE structure according to an eighth embodiment.

Referring to FIG. 39, there is shown a schematic cross-sectional structure of an organic EL device 2 having a thin MPE structure according to an eighth embodiment. The schematic cross-sectional structure shown in FIG. 39 defines an organic EL device 2 having the thin MPE structure in which two light-emitting units U1 and U2 are formed one above the other. The organic EL device 2 having the thin MPE structure according to the eighth embodiment is of a top emission type.

As shown in FIG. 39, the organic EL device 2 having the thin MPE structure according to the eighth embodiment includes a substrate 10, a second electrode layer 20 arranged on the substrate 10, first and second light-emitting units U1 and U2 layered and arranged on the second electrode layer 20, a charge generation layer $22_1$ interposed and arranged between the first and second light-emitting units U1 and U2 and a light-transmitting first electrode layer 12 arranged on the second light-emitting unit U2 positioned highest in the layering direction. Each of the first and second light-emitting units U1 and U2 includes a central organic emission layer $16_1$ or $16_2$, a hole transfer layer $14_1$ or $14_2$ and an electron transfer layer $18_1$ or $18_2$. The distance L1 from the second electrode layer 20 to the center of the first organic emission layer $16_1$ of the first light-emitting unit U1 adjoining to the second electrode layer 20 is from 30 nm to 90 nm. The distance L2 from the second electrode layer 20 to the center of the second organic emission layer $16_2$ of the second light-emitting unit U2 adjoining to the first light-emitting unit U1 is from 195 nm to 255 nm.

In the organic EL device 2 having the thin MPE structure according to the eighth embodiment, as shown in FIG. 39, the distance LG1 from the second electrode layer 20 to the center of the charge generation layer $22_1$ arranged between the first and second light-emitting units U1 and U2 may be from 60 nm to 225 nm.

Each of the first and second light-emitting units U1 and U2 includes a central organic emission layer $16_1$ or $16_2$, a hole transfer layer $14_1$ or $14_2$ and an electron transfer layer $18_1$ or $18_2$. These layers may be arranged, for example, in the order of the hole transfer layer $14_1$ or $14_2$, the organic emission layer $16_1$ or $16_2$ and the electron transfer layer $18_1$ or $18_2$ or in the order of the electron transfer layer $18_1$ or $18_2$, the organic emission layer $16_1$ or $16_2$ and the hole transfer layer $14_1$ or $14_2$ for each of the light-emitting units U1 and U2, from the first electrode layer 12 toward the second electrode layer 20. In other words, the layering order can be appropriately selected depending on the polarity of a bias voltage applied between the first electrode layer 12 and the second electrode layer 20.

Other configurations remain the same as the configurations of the organic EL device 1 according to the first embodiment which has the MPE structure of three units or more. Therefore, the description of these other configurations will not be repeated.

In the organic EL device 2 having the thin MPE structure according to the eighth embodiment, one or both of the first and second light-emitting units U1 and U2 of the structure shown in FIG. 39 may include multiple organic emission layers.

Among the multiple organic emission layers $16_1$ (LE11 and LE12) and the multiple organic emission layers $16_2$ (LE21 and LE22), the organic emission layers LE11 and LE21 having a relatively short emission wavelength are arranged near the second electrode layer 20 in the organic EL device 2 having the thin MPE structure according to the eighth embodiment. This is because, as is apparent in FIGS. 7 through 9, the positions of the emission layers for obtaining higher total luminous flux are shifted toward the second electrode layer 20 as the emission wavelengths of the emission layers grow shorter.

In the organic EL device 2 having the thin MPE structure according to the eighth embodiment, it is also possible to employ the same configuration as the organic EL device 2 having the thin MPE structure according to the seventh embodiment and the first and second modified examples thereof.

In the organic EL device 2 having the thin MPE structure according to the eighth embodiment, it is also possible to employ the same configurations as the concrete examples shown in FIGS. 35 through 38.

With the eighth embodiment, it is possible to provide a top-emission-type organic EL device having the thin MPE structure, which is capable of optimizing the two-unit MPE structure and realizing cost reduction and high power efficiency.

As described above, the present disclosure makes it possible to provide an organic EL device having the thin MPE structure, which is capable of optimizing the MPE structure and realizing cost reduction and high power efficiency.

<Other Embodiments>

While the present disclosure has been described with respect to the first through eighth embodiments, it should be appreciated that the description and the drawings forming a part of the present disclosure are presented by way of illustration and are not intended to limit the present disclosure. It will be apparent to those skilled in the art that many different alternative embodiments, examples, combinations thereof, and management technologies can be derived from the present disclosure.

The present disclosure covers other embodiments not disclosed herein.

The organic EL device of the present disclosure can find its application in a wide variety of fields, for example, a flexible electronics field such as an organic EL display for realization of an organic light-emitting device, a flat panel display or a flexible display, a transparent electronics field, a lighting device, an organic laser, a solar cell, a gas sensor, and a biosensor such as a taste sensor or an odor sensor, and so on.

According to the present disclosure, it is possible to provide an organic EL device having the thin MPE structure, which is capable of optimizing the MPE structure and realizing cost reduction and high power efficiency.

While certain embodiments have been described, these embodiments have been presented by way of example only, and are not intended to limit the scope of the disclosures. Indeed, the novel devices described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An organic EL device, comprising:
   a light-transmitting substrate;
   a light-transmitting first electrode layer arranged on the substrate;
   three or more light-emitting units layered and arranged on the first electrode layer, each of the light-emitting units including a central organic emission layer, a hole transfer layer and an electron transfer layer;
   a plurality of charge generation layers, each of the charge generation layers being interposed and arranged between two corresponding adjacent ones of the light-emitting units; and
   a second electrode layer arranged on the light-emitting unit positioned highest in a layering direction among the light-emitting units,
   the total thickness of the layers interposed between the first electrode layer and the second electrode layer being 360 nm or less,
   wherein the three or more units include:
   a first light-emitting unit adjoining the second electrode layer and having a first organic emission layer, the distance from the second electrode layer to the center of the first organic emission layer of the first light-emitting, unit being from 30 nm to 90 nm;
   a second light-emitting unit adjoining the first light-emitting unit and having a second organic emission layer, the distance from the second electrode layer to the center of the second organic emission layer of the second light-emitting unit being from 195 nm to 255 nm; and
   a third light-emitting unit adjoining the second light-emitting unit and having a third organic emission layer, the distance from the second electrode layer to the center of the third organic emission layer of the third light-emitting unit being from 245 nm to 305 nm.

2. The device of claim 1, wherein the plurality of charge generation layers includes:
   a first charge generation layer arranged between the first light-emitting unit and the second light-emitting unit, the distance from the second electrode layer to the first charge generation layer being from 60 nm to 225 nm; and a second charge generation layer arranged between the second light-emitting unit and the third light-emitting unit, the distance from the second electrode layer to the second charge generation layer being from 225 nm to 275 nm.

3. The device of claim 1, wherein a peak of an emission wavelength in the first light-emitting unit is longer than a peak of an emission wavelength in the second light-emitting unit, and a peak of an emission wavelength in the third light-emitting unit is longer than the peak of the emission wavelength in the first light-emitting unit.

4. The device of claim 1, wherein a peak of an emission wavelength in the third light-emitting unit is longer than a peak of an emission wavelength in the second light-emitting unit, and a peak of an emission wavelength in the first light-emitting unit is longer than the peak of the emission wavelength in the third light-emitting unit.

5. The device of claim 1, wherein a peak of an emission wavelength in the second light-emitting unit is longer than a peak of an emission wavelength in the first light-emitting unit, and a peak of an emission wavelength in the third light-emitting unit is longer than the peak of the emission wavelength in the second light-emitting unit.

6. The device of claim 1, therein a peak of an emission wavelength in the third light-emitting unit is longer than a peak of an emission wavelength in the first light-emitting unit, and the peak of the emission wavelength in the third light-emitting unit is longer than a peak of an emission wavelength in the second light-emitting unit.

7. The devise of claim 1, wherein
a peak of an emission wavelength of the first light-emitting unit is from 500 nm to 600 nm,
a peak of an am emission wavelength of the second light-emitting unit is from 400 nm to 500 nm, and
a peak of an emission wavelength of the third light-emitting unit is from 550 nm to 700 nm.

8. The device of claim 1, wherein
a peak of an emission wavelength of the first light-emitting unit is from 550 nm to 700 nm,
a peak of an emission wavelength of the second light-emitting unit is from 400 nm to 500 nm, and
a peak of an emission wavelength of the third light-emitting unit is from 500 nm to 600 nm.

9. The device of claim 1, wherein
a peak of an emission wavelength of the first light-emitting unit is from 400 nm to 500 nm,
a peak of an emission wavelength of the second light-emitting unit is from 500 nm to 600 nm, and
a peak of an emission wavelength of the third tight-emitting unit is from 550 nm to 700 nm.

10. The device of claim 1, wherein
a peak of an emission wavelength of the first light-emitting unit is from 400 nm to 500 nm,
a peak of an emission wavelength of the second light-emitting unit is from 400 nm to 500 nm, and
a peak of an emission wavelength of the third light-emitting unit is from 500 nm to 700 nm.

11. The device of claim 1, wherein at least one of the light-emitting units includes double emission layers.

12. An organic EL device, comprising:
a substrate;
a second electrode layer arranged on the substrate;
three or more light-emitting units layered and arranged on the second electrode layer, each of the light-emitting units including a central organic emission layer, a hole transfer layer and an electron transfer layer;
a plurality of charge generation layers, each of the charge generation layers being interposed and arranged between two corresponding adjacent ones of the light-emitting units; and
a light-transmitting first electrode layer arranged on the light-emitting unit positioned highest in a layering direction among the light-emitting units,
the total thickness of the layers interposed between the first electrode layer and the second electrode layer being 360 nm or less,
wherein the three or more units includes:
a first light-emitting unit adjoining the second electrode layer and having a first organic emission layer, the distance from the second electrode layer to the center of the first organic emission layer of the first light-emitting unit being from 30 nm to 90 nm;
a second light-emitting unit adjoining the first light-emitting unit and having a second organic emission layer, the distance from the second electrode layer to the center of the second organic emission layer of the second light-emitting unit being from 195 nm to 255 nm; and
a third light-emitting unit adjoining the second light-emitting unit and having a third organic emission layer, the distance from the second electrode layer to the center of the third organic emission layer of the third light-emitting unit being from 245 nm to 305 nm.

13. The device of claim 12, wherein the plurality of charge generation layers includes:
a first charge generation layer arranged between the first light-emitting unit and the second light-emitting unit, the distance from the second electrode layer to the first charge generation layer being from 60 nm to 225 nm; and
a second charge generation layer arranged between the second light-emitting unit and the third light-emitting unit, the distance from the second electrode layer to the second charge generation layer being from 225 nm to 275 nm.

* * * * *